United States Patent
Okubo et al.

(10) Patent No.: US 12,362,210 B2
(45) Date of Patent: Jul. 15, 2025

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Keita Okubo, Toyama (JP); Makoto Nomura, Toyama (JP); Kazuhito Saito, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 377 days.

(21) Appl. No.: 17/939,582

(22) Filed: Sep. 7, 2022

(65) Prior Publication Data
US 2023/0093324 A1  Mar. 23, 2023

(30) Foreign Application Priority Data
Sep. 22, 2021 (JP) .................. 2021-153956

(51) Int. Cl.
H01L 21/67   (2006.01)
H01L 21/677  (2006.01)

(52) U.S. Cl.
CPC .. H01L 21/67276 (2013.01); H01L 21/67745 (2013.01)

(58) Field of Classification Search
CPC ......... H01L 21/67167; H01L 21/67276; H01L 21/67745; H01L 22/00; H01L 29/00;
(Continued)

(56) References Cited

U.S. PATENT DOCUMENTS 5,928,389 A    7/1999 Jevtic
10,824,135 B2  11/2020 Nonobe et al.
(Continued)

FOREIGN PATENT DOCUMENTS

JP  10-199960 A    7/1998
JP  2005252105 A   9/2005
(Continued)

OTHER PUBLICATIONS

Letter of Examination Report with English translation in Taiwan Application No. 111127297, dated Sep. 20, 2023, 8 pages.
(Continued)

*Primary Examiner* — Kidest Bahta
(74) *Attorney, Agent, or Firm* — Edell, Shapiro & Finnan, LLC

(57) ABSTRACT

There is provided a technique capable of improving the throughput by suppressing stagnation of a substrate in a transfer chamber and by reducing unused time. According to one aspect thereof, a substrate processing apparatus includes: a plurality of process chambers in which a substrate among a plurality of substrates is capable of being processed; a transfer chamber provided with a transfer structure capable of transferring the substrate; and a controller configured to be capable of: (a) calculating a substrate transferable time during which the substrate is capable of being transferred to each of the plurality of process chambers; (b) selecting a substrate transfer path to a process chamber among the plurality of process chambers such that the substrate transferable time is the shortest among those calculated in (a); and (c) performing a control of the transfer structure based on the substrate transfer path selected in (b).

15 Claims, 19 Drawing Sheets

(58) Field of Classification Search
CPC ..... H01L 31/00; H01L 2223/00; H01L 33/00; H01L 21/00
See application file for complete search history.

(56) References Cited

U.S. PATENT DOCUMENTS

| | | | |
|---|---|---|---|
| 2004/0240971 A1* | 12/2004 | Tezuka | H01L 21/67742 |
| | | | 414/217 |
| 2007/0176265 A1 | 8/2007 | Takano | |
| 2009/0035103 A1* | 2/2009 | Jo | H01L 21/67161 |
| | | | 901/50 |
| 2015/0139758 A1 | 5/2015 | Ito et al. | |
| 2018/0211850 A1* | 7/2018 | Kondoh | H01L 21/67766 |
| 2019/0371633 A1* | 12/2019 | Takano | H01L 21/67184 |
| 2020/0194296 A1* | 6/2020 | Numakura | H01L 21/6831 |

FOREIGN PATENT DOCUMENTS

| | | |
|---|---|---|
| JP | 2013-239657 A | 11/2013 |
| JP | 2013258260 A | 12/2013 |
| KR | 10-2168365 B1 | 10/2020 |
| WO | 2005055314 A1 | 6/2007 |

OTHER PUBLICATIONS

Request for the Submission of an Opinion with English translation in Korean Application No. 10-2022-0111572, dated Jul. 30, 2024, 15 pages.

* cited by examiner

FIG. 7

| PM No. | T_R [ms] | T_JPre [ms] | T_Pre [ms] | T_Main [ms] | T_Post [ms] | T_CC [ms] | T_T [ms] |
|---|---|---|---|---|---|---|---|
| PM1 | 15000 | | | | 60000 | 300000 | 375000 |
| PM2 | 51000 | | 60000 | 90000 | | | 201000 |
| PM3 | 36000 | | | 120000 | | | 156000 |
| PM4 | 372000 | | | | | | 372000 |

FIG. 11

| SUBSTRATE | DESTINATION PM | $T_R$ [ms] | $T_{JPre}$ [ms] | $T_{Pre}$ [ms] | $T_{Main}$ [ms] | $T_{Post}$ [ms] | $T_{CC}$ [ms] | $T_T$ [ms] |
|---|---|---|---|---|---|---|---|---|
| A | PM3 | 51000 | | | | | | 51000 |
| B | PM2 | 66000 | | 60000 | | | | 126000 |

FIG. 14

| SUBSTRATE | DESTINATION PM | $T_R$ [ms] | $T_{JPre}$ [ms] | $T_{Pre}$ [ms] | $T_{Main}$ [ms] | $T_{Post}$ [ms] | $T_{CC}$ [ms] | $T_T$ [ms] |
|---|---|---|---|---|---|---|---|---|
| A | PM3 | 360000 | | | | | | 360000 |
| B | PM1 | 410000 | | | | | | 410000 |
| C | PM2 | 0 | 300000 | | | | | 300000 |

| SUBSTRATE | DESTINATION PM | $T_R$ [ms] | $T_T$ [ms] | $T_E$ [ms] | $T_V$ [ms] | $T_C$ [ms] | $T_{AT}$ [ms] | $T_{CO}$ [ms] |
|---|---|---|---|---|---|---|---|---|
| UNPROCESSED SUBSTRATE | PM2 | 150000 | 150000 | — | — | — | — | — |
| PROCESSED SUBSTRATE | — | — | — | 21000 | 42000 | 90000 | 70000 | 118000 |

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application claims priority under 35 U.S.C. § 119(a)-(d) to Japanese Patent Application No. 2021-153956, filed on Sep. 22, 2021, the entire contents of which are hereby incorporated by reference.

TECHNICAL FIELD

The present disclosure relates to a substrate processing apparatus, a method of manufacturing a semiconductor device and a non-transitory computer-readable recording medium.

BACKGROUND

Conventionally, a parallel operation of processing a plurality of substrates one by one in a plurality of process chambers may be performed in a substrate processing apparatus. In the parallel operation, for example, when a processing time in each process chamber is different, since a preceding substrate (among the plurality of substrates) may be being processed in a process chamber (among the plurality of process chambers) in which a succeeding substrate (among the plurality of substrates) is scheduled to be processed, a stagnation of a substrate such as the succeeding substrate may occur in a structure such as a transfer chamber. In such a case, even when the process chamber in which the succeeding substrate is scheduled to be processed is empty, the succeeding substrate may not be transferred to the process chamber due to the stagnation. As a result, a throughput may be lowered. Further, a film-forming uniformity may be lowered when a temperature of the process chamber is lowered due to the stagnation.

For example, according to some related arts, even when the processing time in each process chamber is different, by setting a substrate loading interval to be constant, it is possible to suppress the stagnation of the substrate in the process chamber. However, even in such a case, the stagnation may still occur in the structure other than the process chamber.

SUMMARY

According to the present disclosure, there is provided a technique capable of improving a throughput by suppressing an occurrence of a stagnation of a preceding substrate in a structure such as a transfer chamber and by reducing an unused time of a process chamber.

According to one aspect of the technique of the present disclosure, there is provided a substrate processing apparatus including: a plurality of process chambers in which a substrate among a plurality of substrates is capable of being processed; a transfer chamber provided with a transfer structure capable of transferring the substrate; and a controller configured to be capable of: (a) calculating a substrate transferable time during which the substrate is capable of being transferred to each of the plurality of process chambers; (b) selecting a substrate transfer path to a process chamber among the plurality of process chambers such that the substrate transferable time is the shortest among those calculated in (a); and (c) performing a control of the transfer structure based on the substrate transfer path selected in (b).

BRIEF DESCRIPTION OF THE DRAWINGS

FIG. 7 is a table, with respect to each process chamber in the state shown in FIG. 6, summarizing a remaining time of a substrate processing being performed and a scheduled time of a processing to be performed.

FIG. 11 is a table, with respect to a candidate substrate A and another candidate substrate B respectively arranged in load lock chambers in the state shown in FIG. 10, summarizing the remaining time of the substrate processing being performed in process chambers respectively corresponding to the candidate substrate A and the candidate substrate B and the scheduled time of the processing to be performed in the process chambers respectively corresponding to the candidate substrate A and the candidate substrate B.

FIG. 14 is a table, with respect to each of related substrates in the state shown in FIG. 13, summarizing the remaining time of the substrate processing being performed in process chambers respectively corresponding to the related substrates and a processing time of the step of preliminarily adjusting conditions of each process chamber.

DETAILED DESCRIPTION

Embodiments

Hereinafter, one or more embodiments (also simply referred to as "embodiments") according to the technique of the present disclosure will be described with the drawings. The drawings used in the following descriptions are all schematic. Further, while the embodiments will be described based on a substrate processing apparatus configured to process a semiconductor substrate and a method of manufacturing the semiconductor device, the technique of the present disclosure is not limited thereto. For example, the technique of the present disclosure may also be applied to a substrate processing apparatus configured to process a substrate for an LCD (liquid crystal display). In the following descriptions, a substrate such as the semiconductor substrate and the substrate for the LCD may also be simply referred to as a "substrate S".

Configuration of Substrate Processing Apparatus

Figure 1:
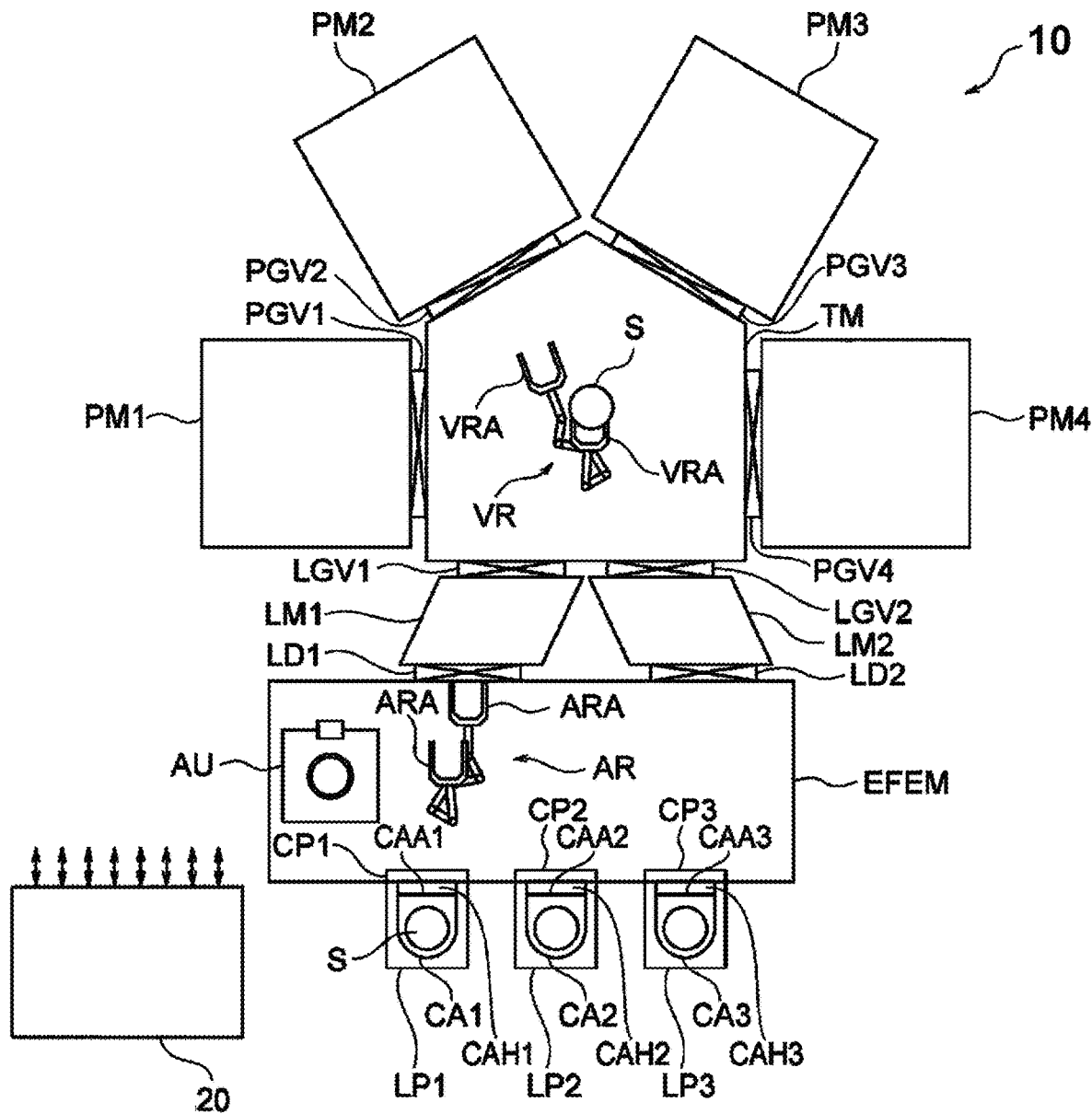
FIG. 1 is a diagram schematically illustrating a configuration of a substrate processing apparatus preferably used in one or more embodiments of the present disclosure.
Figure 2:
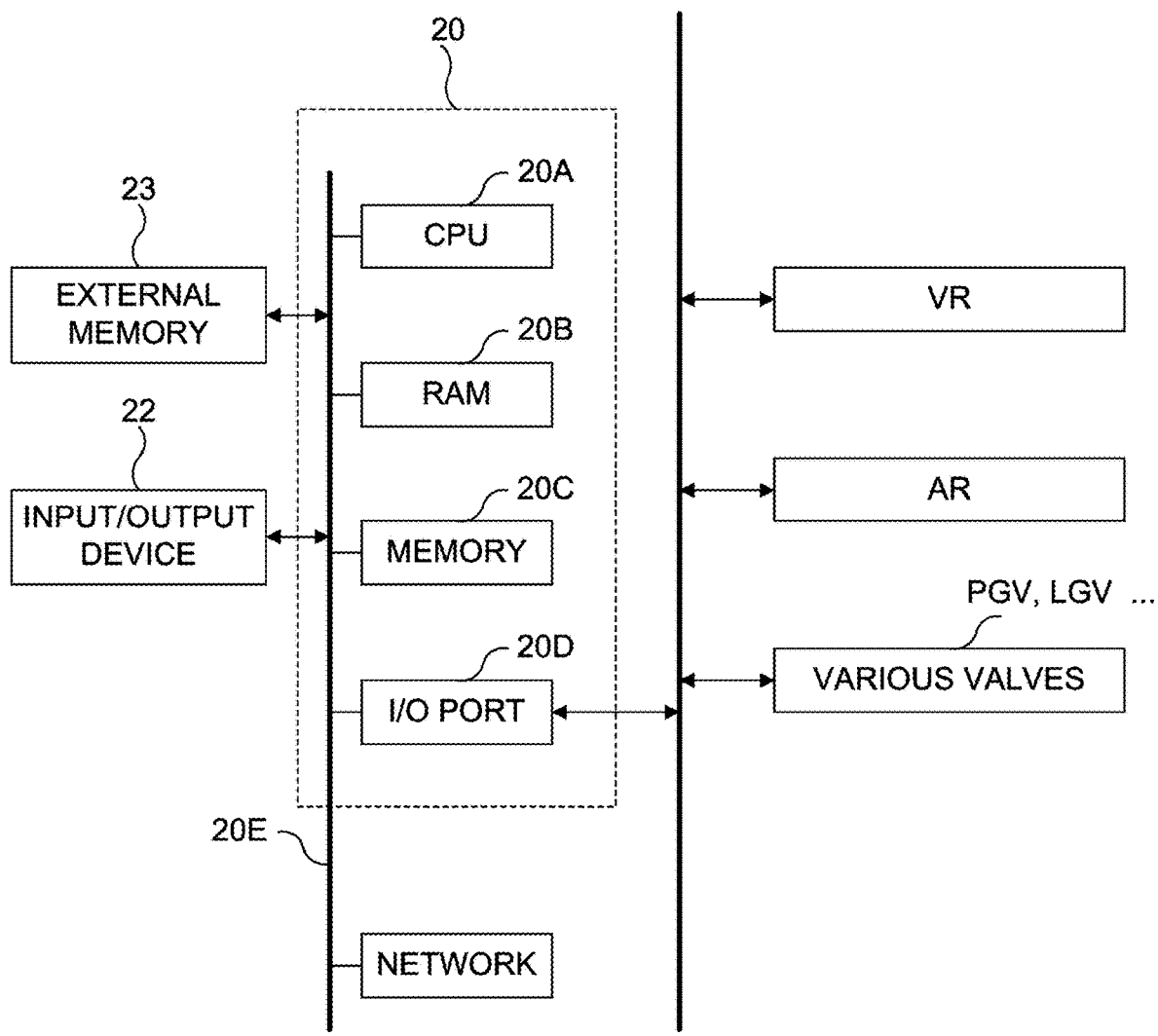
FIG. 2 is a block diagram schematically illustrating a configuration of a controller and related components of the substrate processing apparatus according to the embodiments of the present disclosure.

As shown in FIG. 1, a substrate processing apparatus 10 according to the present embodiments includes a vacuum side configuration of handling the substrate S in a reduced pressure state and an atmospheric pressure side configuration of handling the substrate S in an atmospheric pressure state. The vacuum side configuration mainly includes a vacuum transfer chamber TM, load lock chambers LM1 and LM2 and process chambers (which are processing structures) PM1, PM2, PM3 and PM4 capable of processing the substrate S. The atmospheric pressure side configuration mainly includes an atmospheric pressure transfer chamber EFEM and loading port structures LP1, LP2 and LP3 serving as arrangement structures. Carriers CA1, CA2 and CA3 capable of accommodating a plurality of substrates including the substrate S are transferred and placed on the loading port structures LP1 through LP3, respectively, from an outside of the substrate processing apparatus 10, and are also transferred to the outside of the substrate processing apparatus 10 from the loading port structures LP1 through LP3, respectively. Hereinafter, the plurality of substrates including the substrate S may also be simply referred to as "substrates S". As a result, for example, the substrate S (which is unprocessed) is taken out from the carrier CA1 placed on the loading port structure LP1, is loaded (transferred) into the process chamber PM1 through the load lock chamber LM1 and processed in the process chamber PM1. Then, the substrate S (which is processed) is returned to the carrier CA1 on the loading port structure LP1 in an order reverse to that described above.

Vacuum Side Configuration

The vacuum transfer chamber TM is configured as a vacuum airtight structure capable of withstanding a negative pressure (which is a reduced pressure) below an atmospheric pressure such as a pressure in a vacuum state. Further, according to the present embodiments, for example, a housing of the vacuum transfer chamber TM is pentagonal when viewed from above. The housing of the vacuum transfer chamber TM is of a box shape with closed upper and lower ends in a vertical direction. The load lock chambers LM1 and LM2 and the process chambers PM1 through PM4 are arranged so as to surround an outer periphery of the vacuum transfer chamber TM. In the present specification, the process chambers PM1 through PM4 may be collectively or individually referred to as a "process chamber PM". That is, the process chamber PM may be referred to as a representative of the process chambers PM1 to PM4. In addition, the load lock chambers LM1 and LM2 may be collectively or individually referred to as a "load lock chamber LM". That is, the load lock chamber LM may be referred to as a representative of the load lock chambers LM1 and LM2. The same also applies to other configurations (such as a vacuum robot VR and an arm VRA, which will be described later) of the vacuum side configuration.

The vacuum robot VR is provided in the vacuum transfer chamber TM. The vacuum robot VR serves as a transfer robot (which is a part of a transfer structure described later) capable of transferring the substrate S in the reduced pressure state. The vacuum robot VR is configured to transfer the substrate S between the load lock chamber LM and the process chamber PM by placing the substrate S on two sets of substrate support arms VRA (hereinafter, also be referred to as the "arm VRA"). The arm VRA serves as a substrate support. The vacuum robot VR is configured to be elevated or lowered in the vertical direction while maintaining an airtightness of the vacuum transfer chamber TM. In addition, the two sets of the arm VRA are separated in the vertical direction. Further, each of the two sets of the arm VRA is configured to be capable of being expanded and contracted in a horizontal direction and being rotationally moved in a horizontal plane.

The process chamber PM is provided with a substrate mounting table on which the substrate S is placed. Further, a gas supplier (which is a gas supply structure or a gas supply system) capable of supplying a gas such as a process gas and an exhauster (which is an exhaust structure or an exhaust system) capable of exhausting an inner atmosphere of the process chamber PM are connected to the process chamber PM. For example, the process chamber PM is configured as a single wafer type process chamber in which the substrates S are processed one by one in the reduced pressure state. That is, each of the process chambers PM1 through PM4 serves as a process chamber in which a process (for example, an etching process using a plasma or the like, an ashing process and a film-forming process by a chemical reaction) is performed to the substrate S to provide added values to the substrate S.

The process chamber PM is connected to the vacuum transfer chamber TM by a gate valve PGV serving as an opening/closing valve. As a result, when the gate valve PGV is open, it is possible to transfer the substrate S between the process chamber PM and the vacuum transfer chamber TM under the reduced pressure. Further, when the gate valve PGV is closed, it is possible to perform various processes such as a substrate processing on the substrate S while maintaining an inner pressure of the process chamber PM to a desired pressure and the inner atmosphere of the process chamber PM to a process gas atmosphere.

The load lock chamber LM may function as a mounting structure for transferring the substrate S into the vacuum transfer chamber TM or as a mounting structure for transferring the substrate S out of the vacuum transfer chamber TM. Buffer stages (not shown) configured to temporarily support the substrate S when the substrate S is transferred into or out of the vacuum transfer chamber TM are provided in the load lock chamber LM (that is, in the load lock chambers LM1 and LM2, respectively). Each of the buffer stages may be configured as a multi-stage type slot capable of supporting a predetermined number of substrates (for example, two substrates) including the substrate S.

Further, the load lock chamber LM is connected to the vacuum transfer chamber TM by a gate valve LGV serving as an opening/closing valve, and is connected to the atmospheric pressure transfer chamber EFEM (which will be described later) by a gate valve LD serving as an opening/closing valve. By closing the gate valve LGV provided corresponding to the vacuum transfer chamber TM and opening the gate valve LD provided corresponding to the atmospheric pressure transfer chamber EFEM, it is possible to transfer the substrate S between the load lock chamber LM and the atmospheric pressure transfer chamber EFEM under the atmospheric pressure while maintaining a vacuum airtightness in the vacuum transfer chamber TM.

Further, the load lock chamber LM is configured as a structure capable of withstanding the negative pressure (which is the reduced pressure) below the atmospheric pressure such as the pressure in the vacuum state, and is configured such that an inner atmosphere of the load lock chamber LM can be vacuum-exhausted. Thereby, after the gate valve LD provided corresponding to the atmospheric pressure transfer chamber EFEM is closed and the inner atmosphere of the load lock chamber LM is vacuum-exhausted, the gate valve LGV provided corresponding to the vacuum transfer chamber TM is opened. As a result, it is possible to transfer the substrate S between the load lock chamber LM and the vacuum transfer chamber TM under the reduced pressure while maintaining the vacuum airtightness (vacuum state) in the vacuum transfer chamber TM. As described above, the load lock chamber LM is configured to be capable of being switched between the atmospheric pressure state and the reduced pressure state.

Atmospheric Pressure Side Configuration

On the other hand, as described above, the atmospheric pressure transfer chamber EFEM (Equipment Front End Module) serving as a front module connected to the load lock chambers LM1 and LM2 and the loading port structures LP1 through LP3 serving as the arrangement structures on which the carriers CA1 through CA3 can be placed are provided at an atmospheric pressure portion of the substrate processing apparatus 10. For example, each of the carriers CA1 through CA3 serves as a substrate storage container in which the substrates S corresponding to a single lot (for example, 25 substrates) can be stored. As each of the carriers CA1 through CA3, for example, a FOUP (Front Opening Unified Pod) may be used. In the present specification, the loading port structures LP1 through LP3 may be collectively or individually referred to as a "loading port structure LP". That is, the loading port structure LP may be referred to as a representative of the loading port structures LP1 through LP3. In addition, the carriers CA1 through CA3 may be collectively or individually referred to as a "carrier CA". That is, the carrier CA may be referred to as a representative of the carriers CA1 through CA3. Similar to the vacuum side configuration, the same also applies to other configurations (such as carrier doors CAH1, CAH2 and CAH3 and carrier openers CP1, CP2 and CP3, which will be described later) of the atmospheric pressure side configuration.

For example, an atmospheric pressure robot AR serving as a transfer robot (which is a part of the transfer structure described later) is provided in the atmospheric pressure transfer chamber EFEM. The atmospheric pressure robot AR is configured to transfer the substrate S between the load lock chamber LM1 and the carrier CA placed on the loading port structure LP1. The atmospheric pressure robot AR is also provided with two sets of arms ARA by which the substrate S is placed similar to the vacuum robot VR. The atmospheric pressure robot AR and the vacuum robot VR serve as the transfer structure (which is a transfer system) capable of transferring the substrate S. Further, the atmospheric pressure transfer chamber EFEM and the vacuum transfer chamber TM may be collectively or individually referred to as a "transfer chamber". That is, in the present specification, the term "transfer chamber" may refer to the atmospheric pressure transfer chamber EFEM alone, may refer to the vacuum transfer chamber TM alone, or may refer to both of the atmospheric pressure transfer chamber EFEM and the vacuum transfer chamber TM.

The carrier CA is provided with the carrier door CAH serving as a cap (lid) of the carrier CA. With the carrier door CAH of the carrier CA placed on the loading port structure LP open, the substrate S may be accommodated in the carrier CA by the atmospheric pressure robot AR through a substrate loading/unloading port CAA, or the substrate S in the carrier CA may be transferred out of the carrier CA by the atmospheric pressure robot AR.

Further, in the atmospheric pressure transfer chamber EFEM, the carrier opener CP capable of opening and closing the carrier door CAH is provided adjacent to the loading port structure LP. That is, an inside of the atmospheric pressure transfer chamber EFEM is connected to the loading port structure LP via the carrier opener CP.

The carrier opener CP includes a closure capable of being in close contact with the carrier door CAH and a drive structure capable of operating the closure in the horizontal direction and the vertical direction. The carrier opener CP is configured to open and close the carrier door CAH by moving the closure in the horizontal direction and the vertical direction together with the carrier door CAH while maintaining the closure in close contact with the carrier door CAH.

In the atmospheric pressure transfer chamber EFEM, an aligner AU, which is an orientation flat alignment device capable of aligning a crystal orientation of the substrate S, is provided as a substrate position correction device. In addition, the atmospheric pressure transfer chamber EFEM is provided with a clean air supplier (which is a clean air supply structure or a clean air supply system) (not shown) through which clean air is supplied into the atmospheric pressure transfer chamber EFEM.

The loading port structure LP is configured to place each of the carriers CA1 through CA3 accommodating the substrates S on the loading port structure LP. In each carrier CA, slots (not shown) serving as a storage structure capable of accommodating the substrates S are provided. For example, 25 slots corresponding to the single lot are provided. When the carrier CA is placed, each loading port structure LP is configured to read and store a bar code or the like attached to the carrier CA and indicating a carrier ID used to identify the carrier CA.

Subsequently, a controller (which is a control structure) 20 configured to collectively control the substrate processing apparatus 10 will be described. The controller 20 is configured to control components constituting the substrate processing apparatus 10.

As shown in FIG. 1, the controller 20 may be provided not only inside the substrate processing apparatus 10 but also outside the substrate processing apparatus 10. Further, the controller 20 may be constituted by a general purpose computer such as a PC (personal computer). In such a case, the controller 20 may be configured by installing a program on the general purpose computer by using a computer-readable recording medium such as a USB memory and a DVD in which various programs are stored.

Further, a method of supplying the program for executing the process described above can be appropriately selected. Instead of or in addition to being supplied through a predetermined recording medium as described above, for example, the program may be provided through a communication line, a communication network or a communication system. In such a case, for example, the program may be posted on a bulletin board on the communication network, and may be provided by being superimposed on a carrier wave via the communication network. Further, the program provided as described above may be executed to perform the above-described process under control of an OS (operating system) of the substrate processing apparatus 10 just like any other application programs.

For example, the controller 20 may be constituted by a computer including a CPU (Central Processing Unit) 20A, a RAM (Random Access Memory) 20B, a memory 20C and an I/O port 20D. The RAM 20B, the memory 20C and the I/O port 20D may exchange data with the CPU 20A via an internal bus 20E. For example, an input/output device 22 constituted by components such as a touch panel and a display may be connected to the controller 20 via the internal bus 20E. Further, an external memory (for example, a semiconductor memory such as a USB memory and a memory card) 23 may be connected to the controller 20.

The memory 20C may be constituted by a component such as a flash memory and a hard disk drive (HDD). For example, data such as a control program configured to control operations of the substrate processing apparatus 10 or a program recipe in which information such as sequences and conditions of the substrate processing described later is stored may be readably stored in the memory 20C. Various program recipes such as a process recipe (processing recipe) can be obtained by combining steps of the substrate processing described later such that the process controller 20 can execute the steps to acquire a predetermined result, and functions as a program. Hereinafter, the program recipe and the control program may be collectively or individually referred to as a "program". In the present specification, the term "program" may refer to the program recipe alone, may refer to the control program alone, or may refer to both of the program recipe and the control program.

The RAM 20B functions as a memory area (work area) where a program or data read by the CPU 20A is temporarily stored.

The I/O port 20D is electrically connected to the above-described components such as the vacuum robot VR, the atmospheric pressure robot AR, the valves such as the gate valve PGV and the gate valve LGV described above, switches (not shown) and other configurations to be controlled.

Transfer Step of Transferring Substrate

Figure 3:
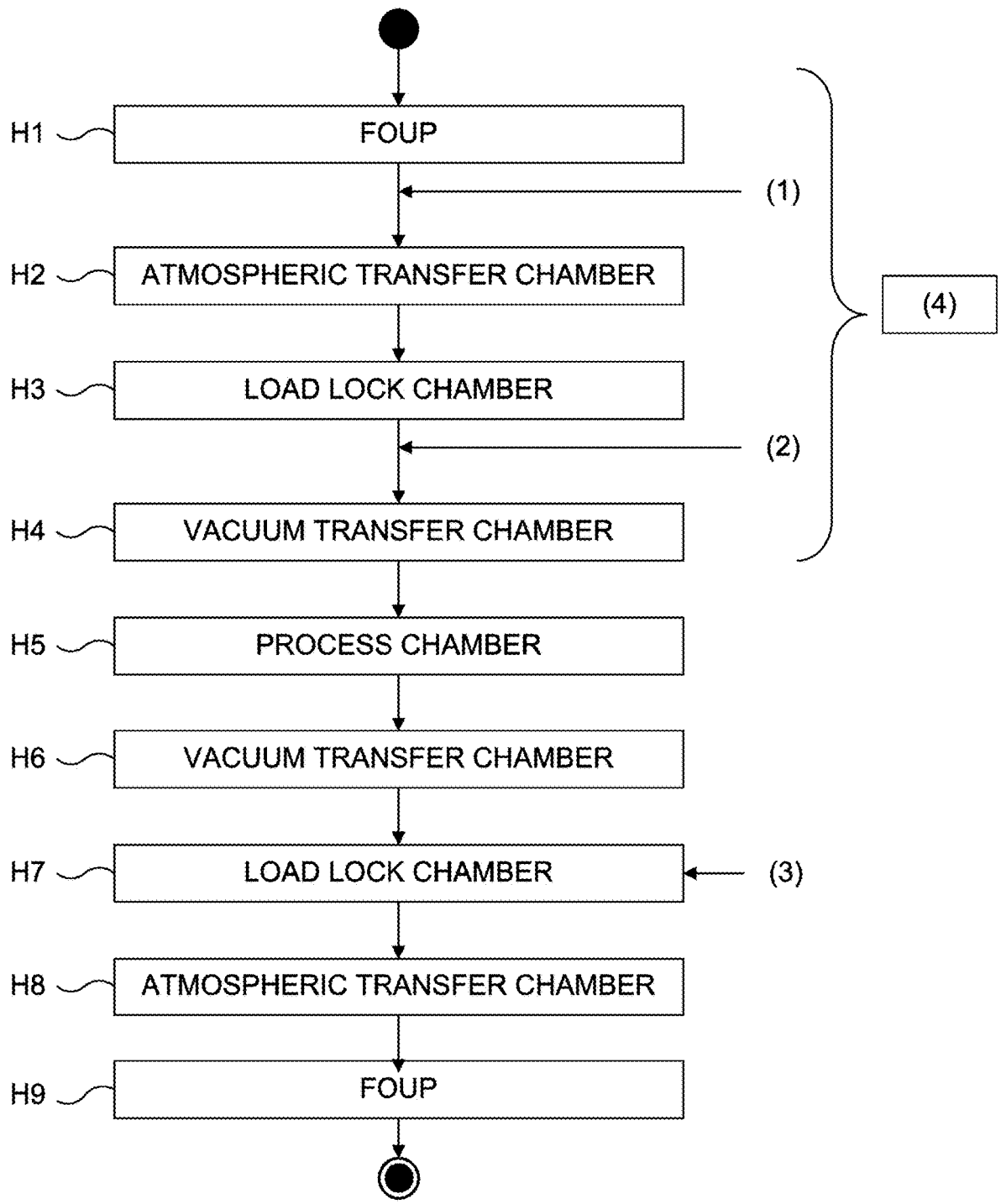
FIG. 3 is a flow chart schematically illustrating a transfer step according to the embodiments of the present disclosure.

FIG. 3 is a flow chart schematically illustrating a transfer step when the substrate S is processed in the substrate processing apparatus 10 according to the present embodiments. The FOUP serving as the carrier CA is placed on the loading port structure LP (step H1), and the substrate S is taken out of the FOUP by using the atmospheric pressure robot AR and transferred into the atmospheric pressure transfer chamber EFEM (step H2). Subsequently, the substrate S is transferred from the atmospheric pressure transfer chamber EFEM to the load lock chamber LM by the atmospheric pressure robot AR (step H3), and is transferred from the load lock chamber LM to the vacuum transfer chamber TM by using the vacuum robot VR (step H4). Then, the substrate S is transferred from the vacuum transfer chamber TM to the process chamber PM by the vacuum robot VR (step H5), and then a processing is performed on the substrate S in the process chamber PM. After the processing in the process chamber PM is completed, the substrate S is transferred from the process chamber PM to the vacuum transfer chamber TM by the vacuum robot VR (step H6), and is transferred from the vacuum transfer chamber TM to the load lock chamber LM by the vacuum robot VR (step H7). Then, the substrate S is transferred from the load lock chamber LM to the atmospheric pressure transfer chamber EFEM by the atmospheric pressure robot AR (step H8), and the substrate S is returned from the atmospheric pressure transfer chamber EFEM into the FOUP by using the atmospheric pressure robot AR (step H9).

Hereinafter, in the substrate processing apparatus 10 where the transfer step is performed, a control of the transfer structure and a control of the transfer chamber (that is, the vacuum transfer chamber TM and the atmospheric pressure transfer chamber EFEM) will be described. In the controller 20, the following four items are determined periodically at each timing. Further, in the present embodiments, a state in which the substrate S is "in the substrate processing apparatus 10" includes a state in which the substrate S is out of the FOUP, and does not include a state in which the substrate S is accommodated in the FOUP on the loading port structure LP.

Item (1): An available time of each process chamber PM is calculated from a transfer time and a scheduled time for processing an entirety of the substrates S already transferred into the substrate processing apparatus 10. Then, among the substrates S, the substrate S capable of being transferred to the process chamber PM in the shortest time (that is, the substrate S capable of being used in a destination process chamber among the process chamber PM in the shortest time) is transferred (or loaded) from the FOUP of the loading port structure LP into the atmospheric pressure transfer chamber EFEM in a state where decision information of the process chamber PM is assigned to the substrate S (between the step H1 and the step H2 shown in FIG. 3). A transfer path of the substrate S to the process chamber PM corresponding to the substrate S may also referred to as a "substrate transfer path".

Item (2): For each of the substrates S (which are unprocessed) in the substrate processing apparatus 10, a transferable time during which the substrate S is capable of being transferred to the process chamber PM (where the substrate S is processed) is calculated. That is, a time during which the destination process chamber PM is capable of being used is calculated. Then, the substrate S capable of being transferred to the process chamber PM in the shortest time is transferred to the vacuum transfer chamber TM (between the step H3 and the step H4 shown in FIG. 3).

Item (3): When a stagnation of the substrate S is unavoidable due to a preceding substrate (or preceding substrates) among the substrates S previously transferred in the substrate processing apparatus 10, a time for eliminating the stagnation is calculated from the transfer time and the scheduled time for processing the substrate S. Hereinafter, the preceding substrate (or the preceding substrates) among the substrates S may also be referred to as a "preceding substrate S" (or "preceding substrates S"). Then, based on the time for eliminating the stagnation and a time for performing a step of preliminarily adjusting conditions of the process chamber PM, a timing of performing the step of preliminarily adjusting conditions of the process chamber PM is controlled.

Item (4): Both of an unprocessed substrate (or unprocessed substrates) and a processed substrate (or processed substrates) may be provided as the substrates S in the load lock chamber LM (mounting structure) of the substrate processing apparatus 10. Hereinafter, the unprocessed substrate (or unprocessed substrates) among the substrates S may also be referred to as a "unprocessed substrate S" (or "unprocessed substrates S"), and the processed substrate (or processed substrates) among the substrates S may also be referred to as a "processed substrate S" (or "processed substrates S"). In such a case, from the transferable time during which the unprocessed substrate S is capable of being transferred to the process chamber PM and a time for transferring the processed substrate S to the FOUP (which is calculated from a time for performing an intake and exhaust operation of the load lock chamber LM, a time for cooling the processed substrate S and the transfer time in the atmospheric pressure transfer chamber EFEM), it is determined whether or not there is a delay in transferring the unprocessed substrate S to the process chamber PM by transferring the processed substrate S to the FOUP. Only when it is determined that there is no delay, the processed substrate S is transferred to the FOUP, and thereby, a vacancy is provided (or created) in the load lock chamber LM (mounting structure).

Hereinafter, each of the items (1) through (4) (also referred to as controls (1) through (4)) will be described with reference to examples below.

(1) Transfer Control of Loading Substrate S into Substrate Processing Apparatus 10

Figure 4:
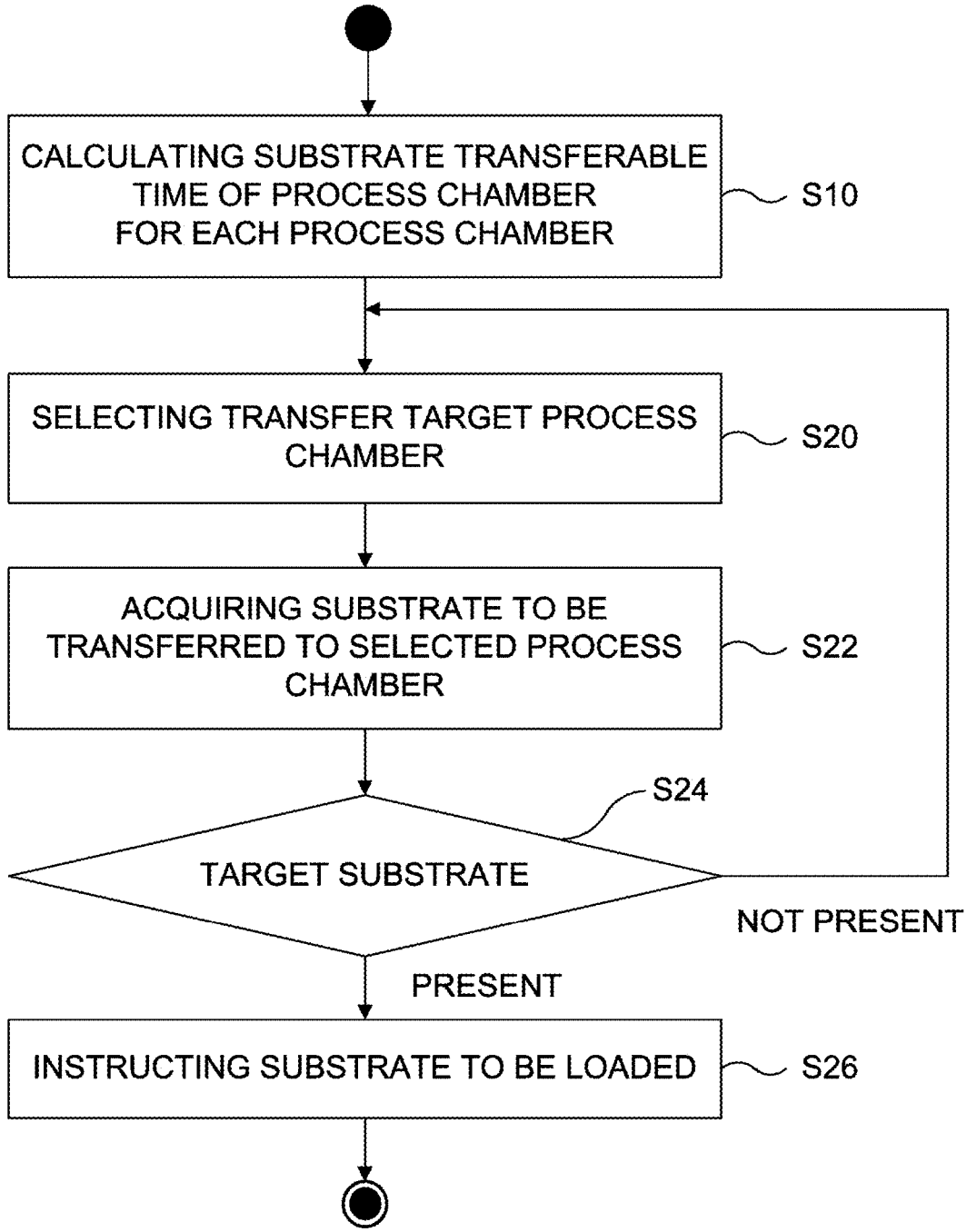
FIG. 4 is a flow chart schematically illustrating a transfer control of loading a substrate into the substrate processing apparatus according to the embodiments of the present disclosure.

As shown in FIG. 4, first, an available time TT of the process chamber PM is calculated for each process chamber PM (step S10). The available time TT is calculated from information of the substrate S already transferred into the substrate processing apparatus 10.

Figure 5:
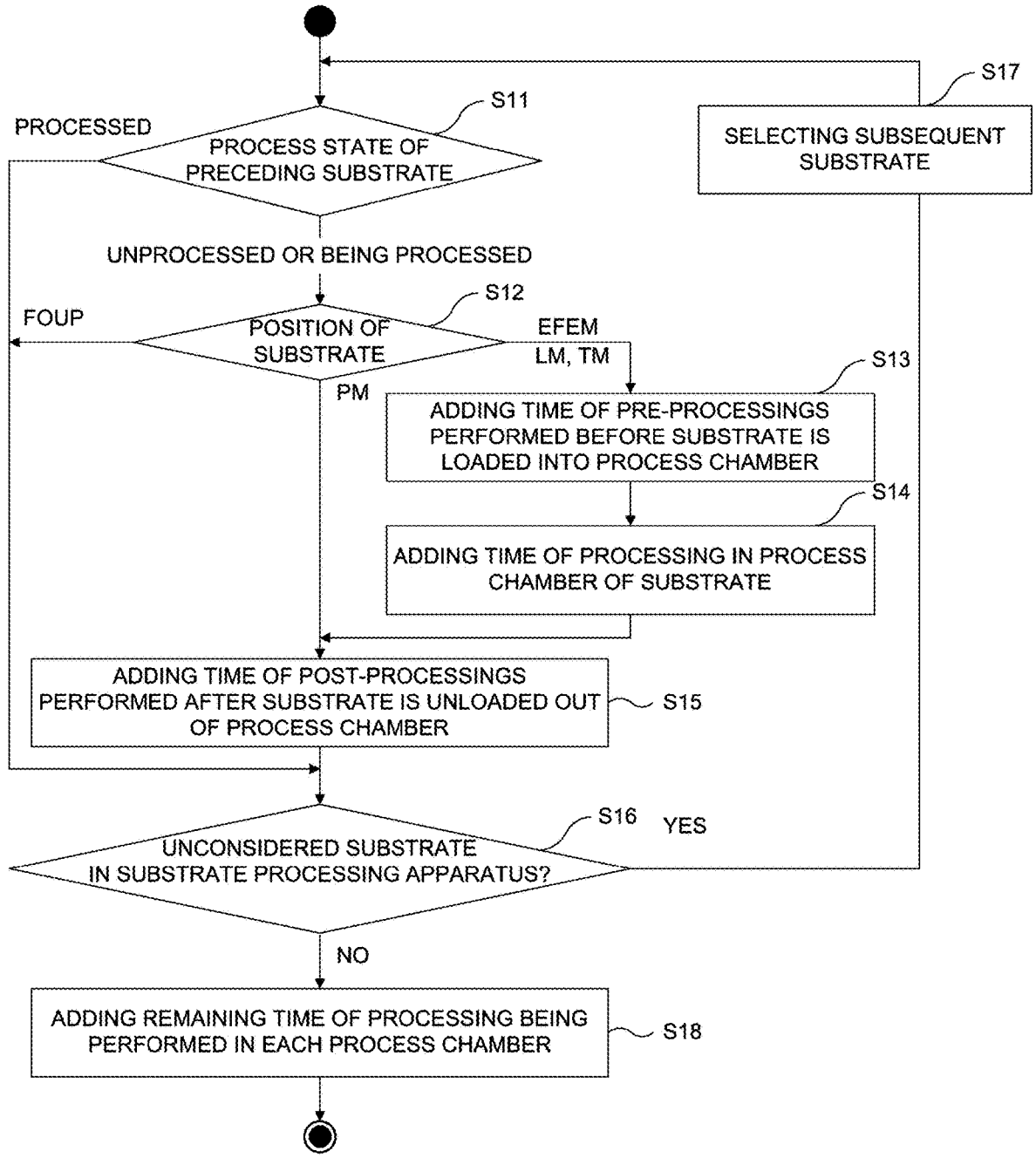
FIG. 5 is a flow chart schematically illustrating a calculation step of calculating a substrate transferable time according to the embodiments of the present disclosure.

As shown in FIG. 5, in a calculation step of calculating a substrate transferable time, a process state of the preceding substrate S already transferred into the substrate processing apparatus 10 is confirmed (or checked) in a step S11. The process state is confirmed for each substrate S. When the process state of the substrate S is a processed state, a step S16 is performed. When the process state of the substrate S is an unprocessed state or a processing state (in which the substrate S is being processed), a step S12 is performed. In the step S12, a position of the substrate S is confirmed. When the position of the substrate S is in the FOUP, the step S16 is performed. When the position of the substrate S is in the process chamber PM, a step S15 is performed. In other cases, that is, when the position of the substrate S is in the atmospheric pressure transfer chamber EFEM (including the aligner AU), the load lock chamber LM or the vacuum transfer chamber TM, a step S13 is performed in the step S13, a scheduled execution time of pre-processings (such as a JOB pre-processing, a pre-processing and a warm-up type pre-processing) performed in the process chamber PM before the substrate S is transferred into the process chamber PM is added as the substrate transferable time of the process chamber PM, and in a step S14, a scheduled time of the processing (main-processing) in the process chamber PM of the substrate S is added. Then, the step S15 is performed.

In the step S15, a scheduled execution time of post-processings (such as a post-processing, a sheet cleaning processing and a JOB post-processing) performed after the substrate S is transferred out of the process chamber PM is added to the available time TT of the process chamber PM (which is a target process chamber PM). Then, the step S16 is performed.

In the step S16, it is determined whether or not the substrate transferable time is completely calculated for an entirety of the substrates S in the substrate processing apparatus 10. When it is determined that, in the step S16, there is a substrate among the substrates S in the substrate processing apparatus 10 for which the substrate transferable time has not been calculated (hereinafter, also referred to as an "unconsidered substrate", in a step S17, a subsequent substrate (that is, the unconsidered substrate) among the substrates S is selected, and the step S11 is performed again. When it is determined that, in the step S16, the substrate transferable time is completely calculated for the entirety of the substrates S in the substrate processing apparatus 10, in a step S18, a remaining time TR of the substrate processing of the target process chamber PM is added to the available time TT of the process chamber PM. Thereby, the calculation step of calculating the substrate transferable time is completed. By performing the calculation step of calculating the substrate transferable time, it is possible to calculate the available time (that is, the substrate transferable time) TT for each process chamber PM.

Subsequently, a step S20 shown in FIG. 4 is performed. In the step S20, a transfer target process chamber PM is selected. The transfer target process chamber PM is selected sequentially in an ascending order of the substrate transferable time TT starting from the process chamber PM of the shortest substrate transferable time TT among the process chambers PM, wherein the substrate transferable time TT is calculated in the calculation step of calculating the substrate transferable time.

Subsequently, in a step S22, the substrate S to be transferred to the process chamber PM selected in the step S20 is acquired. When the substrate S using the process chamber PM selected in the step S20 is in the FOUP and the substrate S is capable of being loaded (or charged) to the substrate processing apparatus 10, the substrate S is acquired in the step S22. Then, in a step S24, it is determined whether or not the substrate S is capable of being acquired, that is, whether or not a target substrate among the substrates S exists. Hereinafter, the target substrate among the substrates S may also be referred to as a target substrate S. When it is determined, in the step S24, that the target substrate S does not exist, the step S20 is performed again, and a process chamber with the next shortest substrate transferable time TT is selected as the transfer target process chamber PM. Then, the steps S22 and S24 described above are performed again. When it is determined, in the step S24, that the substrate S is capable of being acquired, that is, the target substrate S exists, the substrate S is instructed to be loaded in a step S26, and then, the transfer control of loading (or charging) the substrate S into the substrate processing apparatus 10 is terminated.

Figure 6:
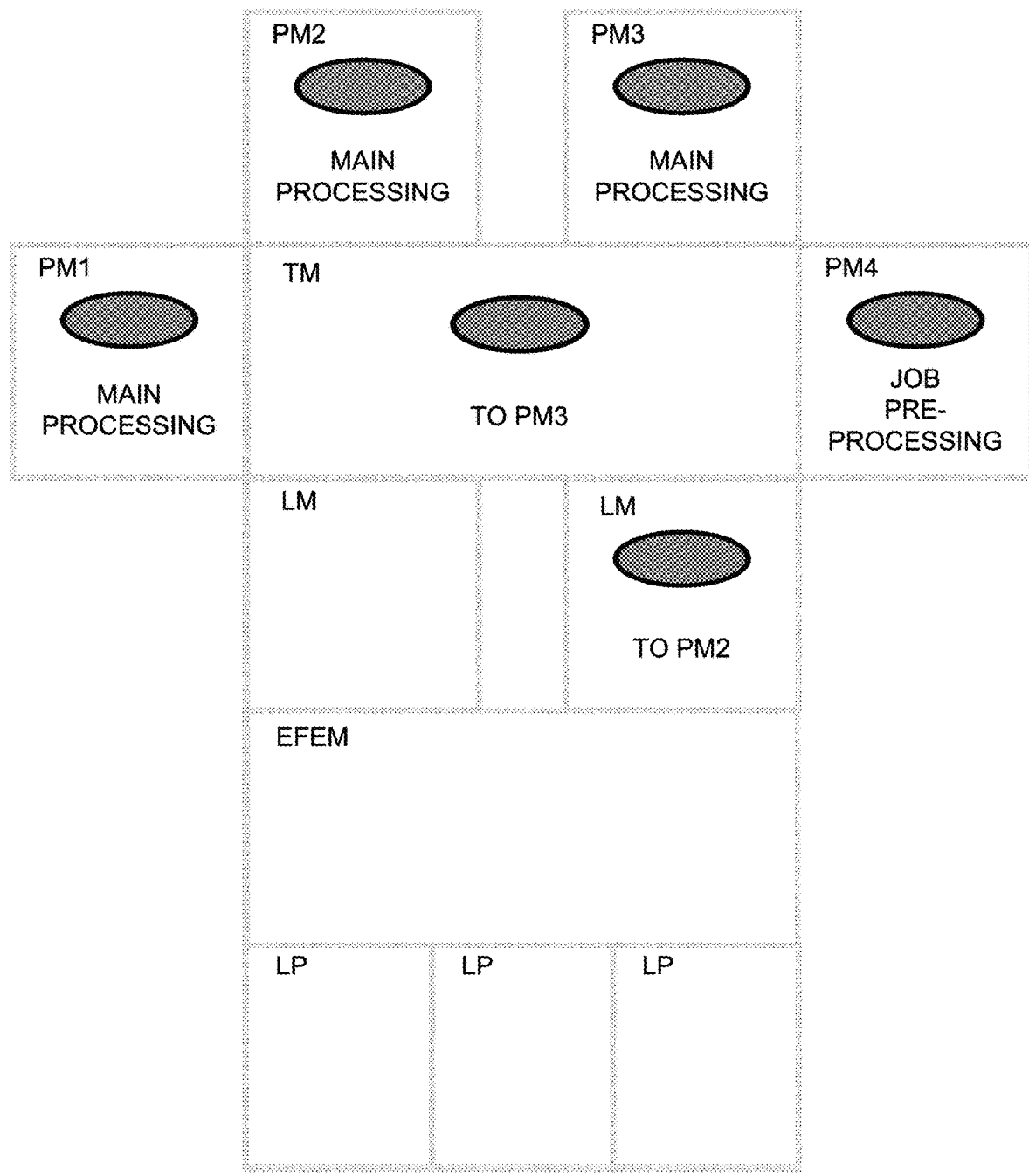
FIG. 6 is a diagram schematically illustrating an exemplary state of a substrate arrangement at a determination timing of the transfer control of loading the substrate into the substrate processing apparatus.

Referring to FIGS. 6 and 7, an example of the transfer control of loading the substrate S into the substrate processing apparatus 10 will be described.

FIG. 6 is a diagram schematically illustrating an exemplary state of the substrate processing apparatus 10 at a determination timing (between the step H1 and the step H2 shown in FIG. 3) of the transfer control of loading the substrate S into the substrate processing apparatus 10. In the substrate processing apparatus 10, the substrates S are respectively present in the process chambers PM1, PM2 and PM3, the vacuum transfer chamber TM and the load lock chamber LM. That is, a total of five substrates are present as the preceding substrates S.

FIG. 7 is a table, with respect to each process chamber PM in the state shown in FIG. 6, summarizing the remaining time of the substrate processing being performed (that is, the remaining time TR of the substrate processing) and the scheduled time of the processing to be performed. Each time T in the table shown in FIG. 7 corresponds to the following. The same also applies to tables shown in FIGS. 11, 14 and 18 described later. Among the times shown in FIG. 7, a processing time in the vacuum transfer chamber TM and a processing time in the atmospheric pressure transfer chamber EFEM correspond to the transfer time of the present embodiments.

TR: the remaining time of the substrate processing in the process chamber PM (including the JOB pre-processing being performed);
TJPre: the scheduled execution time of the JOB pre-processing;
TMain: the scheduled execution time of the main-processing;
TPre: the scheduled execution time of the pre-processing;
TPost: the scheduled execution time of the post-processing;
TCC: the scheduled execution time of the sheet cleaning processing;
TT: the time during which the target substrate S is capable of being transferred to the process chamber PM (that is, the substrate transferable time);
TE: a time for adjusting an inner atmosphere of the mounting structure to an atmosphere of the atmospheric pressure state;
TV: a time for adjusting the inner atmosphere of the mounting structure to an atmosphere of the vacuum state;
TC: the time for cooling the target substrate S;
TAT: a time for transferring the target substrate S in the atmosphere pressure state; and
TCO: a time for unloading (or discharging) the target substrate S out of the mounting structure (that is, an unloading time of the substrate S).

As shown in FIG. 7, the substrate transferable time TT of the process chamber PM1 is 375,000 ms, which is obtained by adding the remaining time TR of the substrate processing, the scheduled execution time TPost of the post-processing, and the scheduled execution time TCC of the sheet cleaning processing. The substrate transferable time TT of the process chamber PM2 is 201,000 ms, which is obtained by adding the remaining time TR of the substrate processing, the scheduled execution time TPre of the pre-processing with respect to the substrate S (which will be transferred to the process chamber PM2) waiting in the load lock chamber LM and the scheduled execution time TMain of the main-processing. The substrate transferable time TT of the process chamber PM3 is 156,000 ms, which is obtained by adding the remaining time TR of the substrate processing and the scheduled execution time TMain of the main-processing with respect to the substrate S (which will be transferred to the process chamber PM3) waiting in the vacuum transfer chamber TM. The substrate transferable time TT of the process chamber PM4 is 372,000 ms, which is the remaining time TR of the substrate processing (In FIG. 7, the JOB pre-processing being performed is recorded as the remaining time TR of the substrate processing).

Thus, by selecting the substrate transfer path which leads to the process chamber PM with the shortest substrate transferable time TT, it is possible to determine that the substrate S to be loaded is the substrate S to be transferred to the process chamber PM3 of the shortest substrate transferable time TT. By loading the substrate S of the shortest substrate transferable time TT, it is possible to reduce an undesirable waiting time while transferring the substrate S. As a result, it is possible to contribute to an improvement of a production throughput.

(2) Transfer Control of Transferring Substrate S to Vacuum Transfer Chamber

Among the unprocessed substrates S in the substrate processing apparatus 10, which unprocessed substrate S is to be transferred to the vacuum transfer chamber TM is determined as follows.

Figure 8:
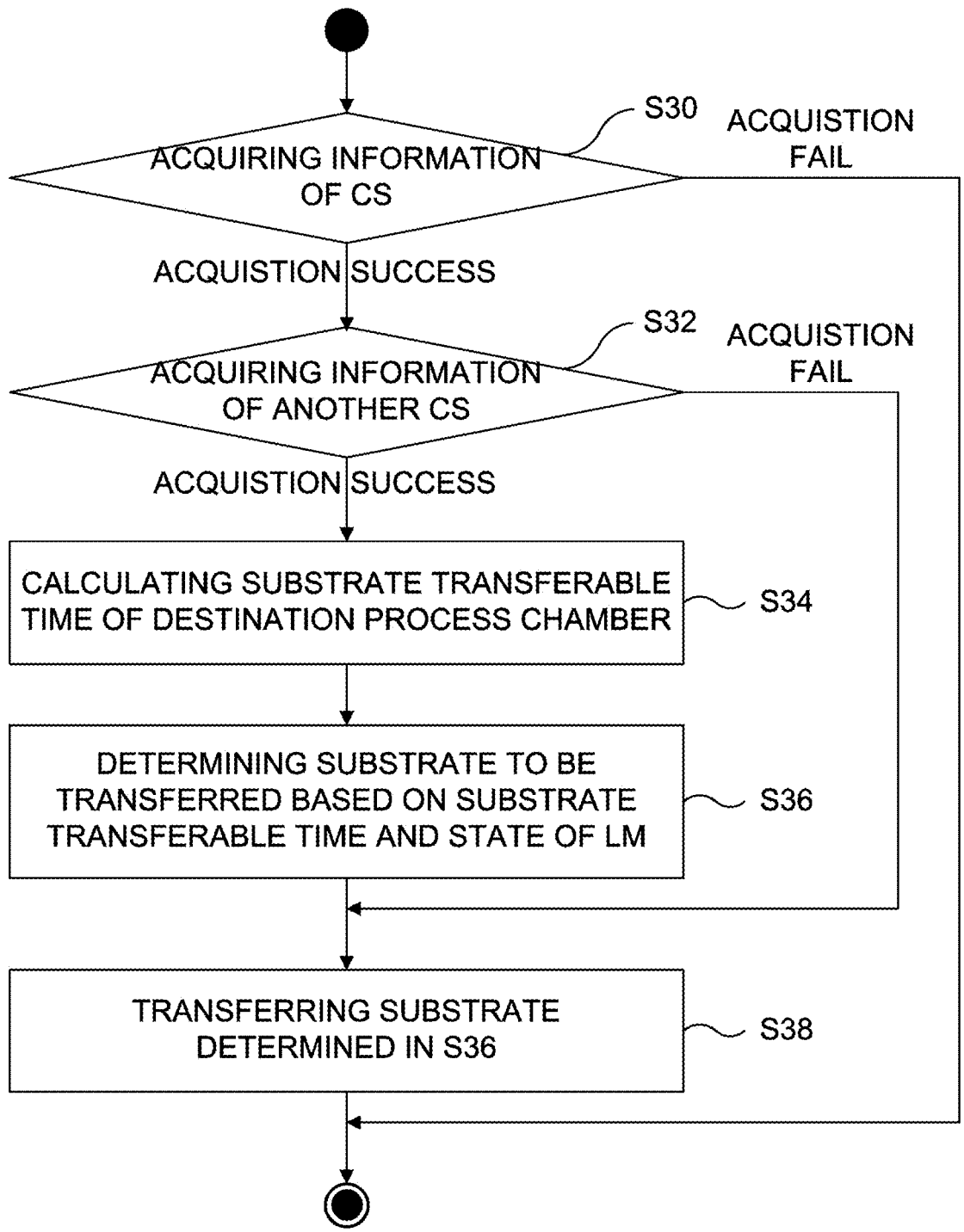
FIG. 8 is a flow chart schematically illustrating a transfer control of transferring the substrate to a vacuum transfer chamber according to the embodiments of the present disclosure.

As shown in FIG. 8, first, in a step S30, the unprocessed substrate S (hereinafter, also referred to as a "candidate substrate S") (which is a transfer candidate in the load lock chamber LM in an EVAC (exhaust) completed state) is acquired. The candidate substrate S is indicated by "CS" in FIG. 8. When the candidate substrate S cannot be acquired (that is, the candidate substrate S does not exist), a transfer control of transferring the substrate S to the vacuum transfer chamber TM is ended. When the candidate substrate S is acquired, in a step S32, as another transfer candidate (hereinafter referred to as "another candidate substrate S"), another unprocessed substrate S in the load lock chamber LM in the EVAC (exhaust) incomplete state or another unprocessed substrate S in the atmospheric pressure transfer chamber EFEM (including the aligner AU) is acquired. The above-mentioned another candidate substrate S is indicated by "ANOTHER CS" in FIG. 8. When the above-mentioned another candidate substrate S cannot be acquired (that is, the above-mentioned another candidate substrate S does not exist), a step S38 is performed.

When the above-mentioned another candidate substrate S is acquired in the step S32, in a step S34, with respect to the candidate substrate S and the above-mentioned another candidate substrate S acquired in the step S30 and the step S32, respectively, the substrate transferable time TT of each process chamber PM (that is, the destination process chamber) corresponding to each of the candidate substrate S and the above-mentioned another candidate substrate S is calculated. The substrate transferable time TT is obtained by adding the remaining time TR of the substrate processing performed in the process chamber PM at a determination timing and a scheduled execution time of a substrate transfer pre-processing (such as the JOB pre-processing and the pre-processing) performed until the candidate substrate S is transferred to the process chamber PM after the substrate processing is completed. Further, when the substrate S to be transferred is present in the process chamber PM, the scheduled execution time of the post-processings (such as the post-processing, the sheet cleaning processing and the JOB post-processing) performed after the substrate S is unloaded out of the process chamber PM is further added thereto to obtain the substrate transferable time TT.

Figure 9:
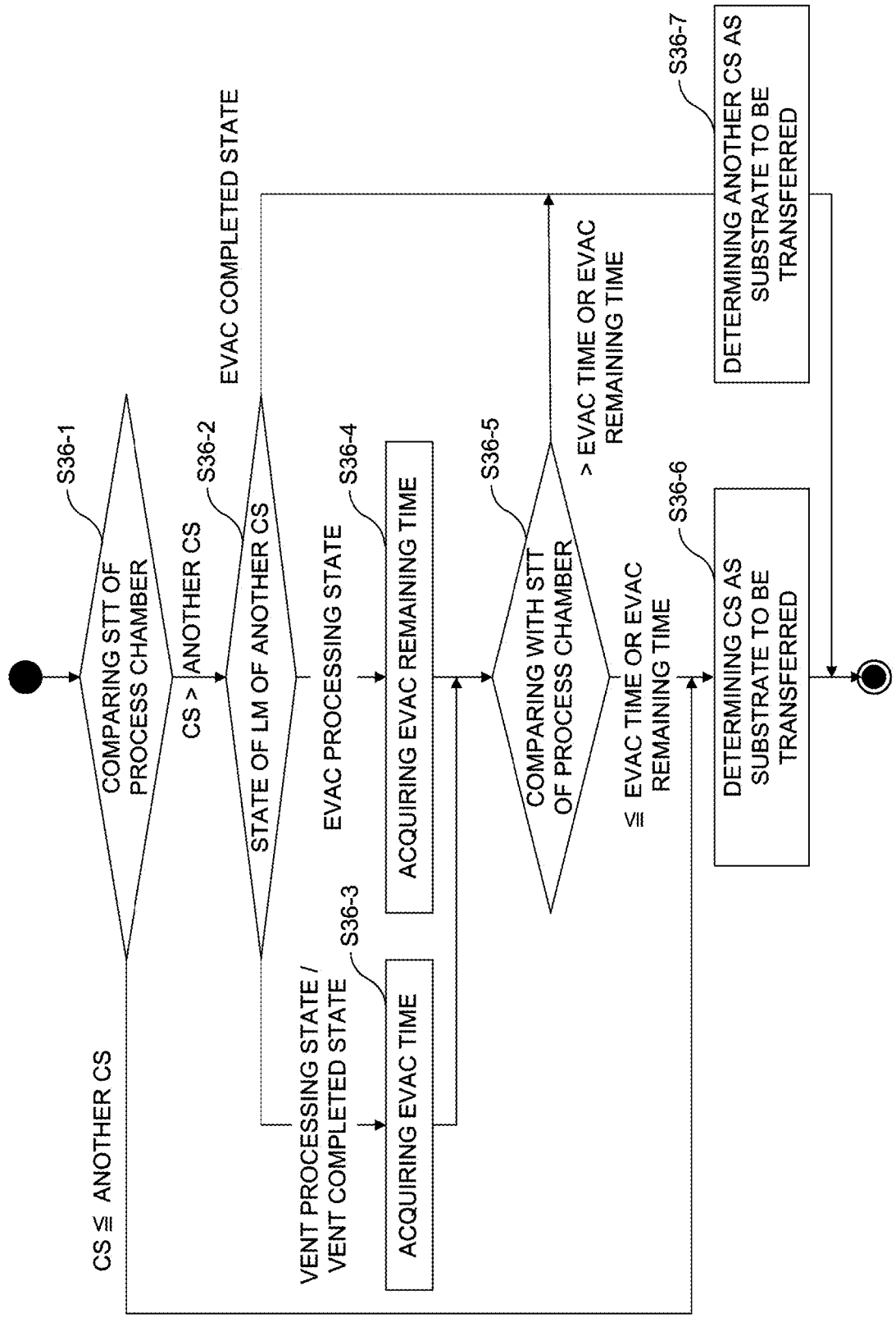
FIG. 9 is a flow chart schematically illustrating a determination step of determining a transfer substrate according to the embodiments of the present disclosure.

Subsequently, a step S36 in performed. In the step S36, with respect to the candidate substrate S and the above-mentioned another candidate substrate S, a determination step of determining the substrate S to be transferred (hereinafter, also referred to as a transfer substrate S) is performed from the substrate transferable time TT and a state of the load lock chamber LM. In the determination step of determining the transfer substrate S, as shown in FIG. 9, the substrate transferable time TT of the destination process chamber PM of each substrate S is compared, and the substrate transferable time TT is compared in a step S36-1. The candidate substrate S is indicated by "CS" in FIG. 9, and the substrate transferable time TT of the destination process chamber PM for each substrate S is indicated by "STT" in FIG. 9. When the substrate transferable time TT of the candidate substrate S is equal to or less than the substrate transferable time TT of the above-mentioned another candidate substrate S, a step S36-6 is performed. When the substrate transferable time TT of the candidate substrate S is longer than the substrate transferable time TT of the above-mentioned another candidate substrate S, a step S36-2 is performed.

In the step S36-2, the state of the load lock chamber LM of the above-mentioned another candidate substrate S is confirmed. When the load lock chamber LM is a VENT (open to the atmospheric pressure) processing state or a VENT completed state, a step S36-3 is performed. When the load lock chamber LM is in the EVAC completed state, a step S36-7 is performed. When the load lock chamber LM is in an EVAC processing state, a step S36-4 is performed. In the step S36-3, an EVAC time is acquired, and then, a step S36-5 is performed. In the step S36-4, an EVAC remaining time is acquired, and then, the step S36-5 is performed.

In the step S36-5, the EVAC time or the EVAC remaining time is compared with the substrate transferable time TT of the process chamber PM. When the substrate transferable time TT of the process chamber PM is equal to or less than the EVAC time or the EVAC remaining time, the step S36-6 is performed, and the candidate substrate S is determined as the transfer substrate S. When the substrate transferable time TT of the process chamber PM is longer than the EVAC time or the EVAC remaining time, the step S36-7 is performed, and the above-mentioned another candidate substrate S is determined as the transfer substrate S.

Then, the step S38 in FIG. 8 is performed. In the step S38, the substrate S determined as the transfer substrate S is transferred to the vacuum transfer chamber TM. Thereby, the transfer control of transferring the substrate S to the vacuum transfer chamber TM is completed.

Figure 10:
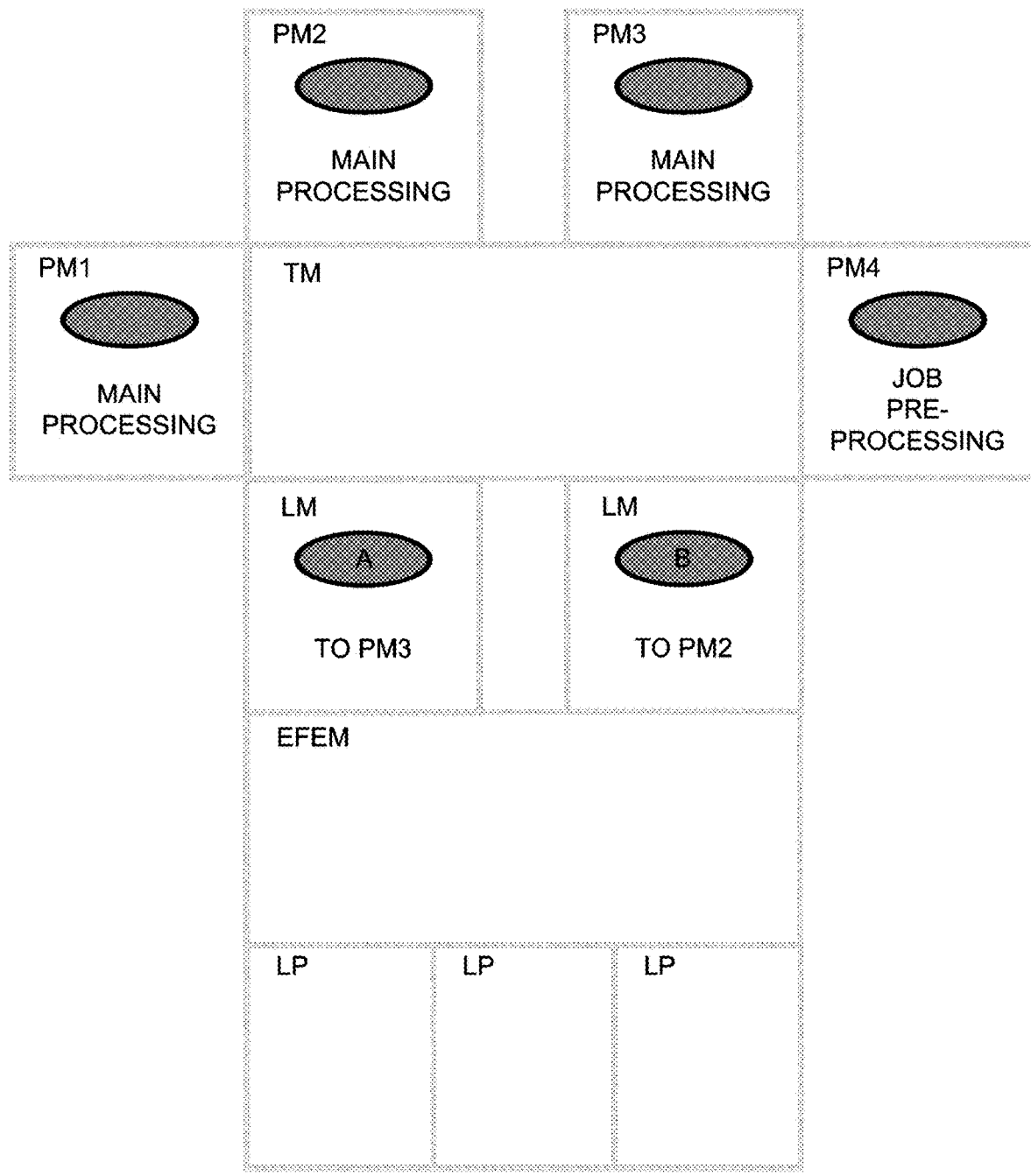
FIG. 10 is a diagram schematically illustrating an exemplary state of the substrate arrangement at a determination timing of the transfer control of transferring the substrate to the vacuum transfer chamber according to the embodiments of the present disclosure.

Referring to FIGS. 10 and 11, an example of the transfer control of transferring the substrate S to the vacuum transfer chamber TM will be described.

FIG. 10 is a diagram schematically illustrating an exemplary state of the substrate processing apparatus 10 at a determination timing (between the step H3 and the step H4 shown in FIG. 3) of the transfer control of transferring the substrate S to the vacuum transfer chamber TM. In the substrate processing apparatus 10, the substrates S are respectively present in the process chambers PM1, PM2 and PM3, and the two load lock chambers LM (that is, the load lock chambers LM1 and LM2). That is, a total of five substrates are present as the substrates S.

FIG. 11 is a table, with respect to the candidate substrate S ("A" shown in FIG. 10) and the above-mentioned another candidate substrate S ("B" shown in FIG. 10) arranged in the load lock chamber LM in the state shown in FIG. 10, summarizing the remaining time of the substrate processing being performed (that is, the remaining time TR of the substrate processing) and the scheduled time of the processing to be performed in the corresponding process chamber PM.

As shown in FIG. 11, the substrate transferable time TT of the candidate substrate S ("A") is 51,000 ms, which is the remaining time TR of the substrate processing in the process chamber PM3 (that is, the destination process chamber of the candidate substrate S). The substrate transferable time TT of the above-mentioned another candidate substrate S ("B") is 126,000 ms, which is obtained by adding the remaining time TR of the substrate processing in the process chamber PM2 (that is, the destination process chamber of the above-mentioned another candidate substrate S) and the scheduled execution time TPre of the pre-processing. Thus, by selecting the substrate transfer path which leads to the process chamber PM with the shortest substrate transferable time TT, it is possible to determine that the substrate S (that is, the candidate substrate S ("A")) is transferred to the vacuum transfer chamber TM with the shortest substrate transferable time TT.

Figure 12:
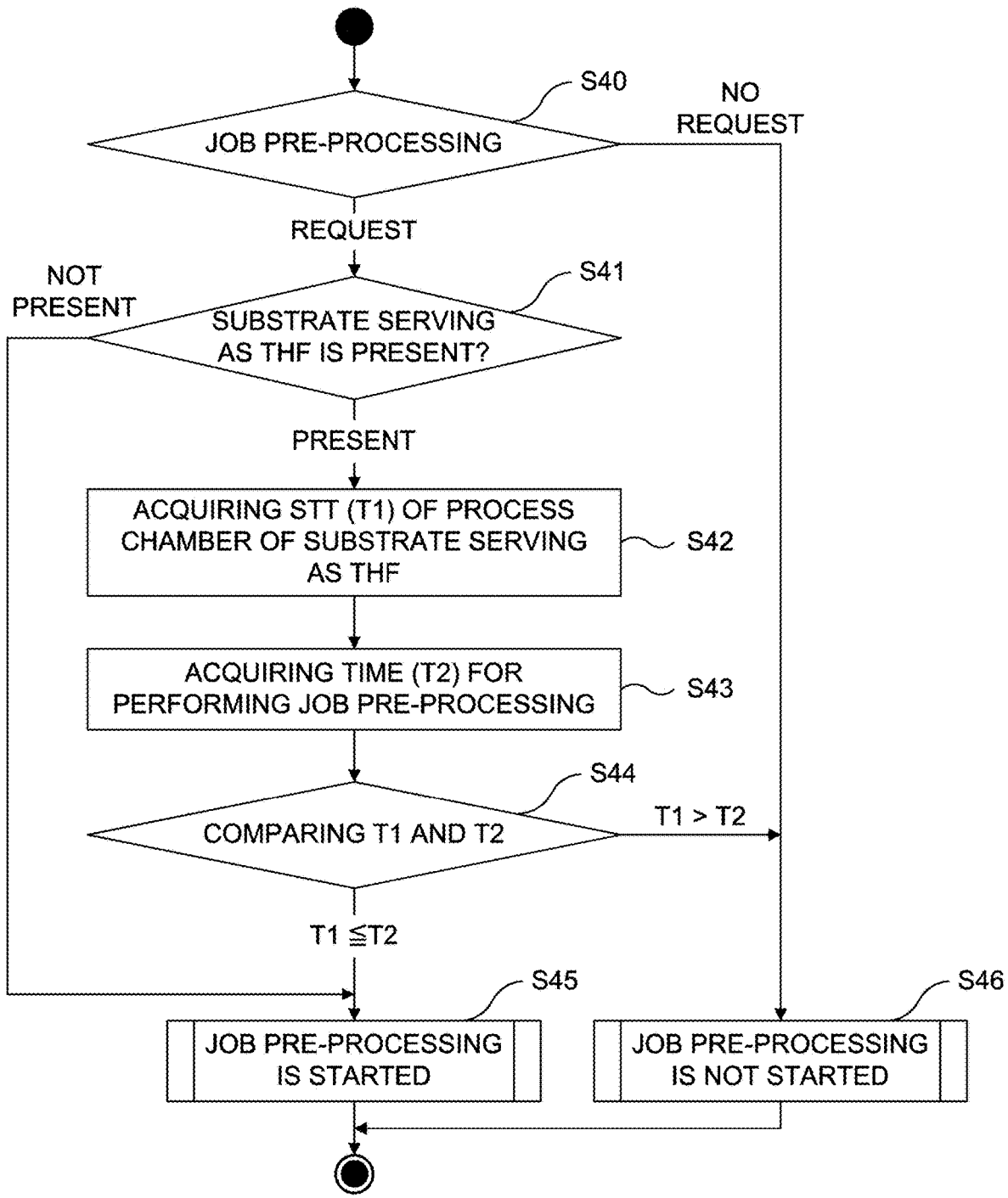
FIG. 12 is a flow chart schematically illustrating a determination step of determining an execution timing of a step of preliminarily adjusting conditions of each process chamber according to the embodiments of the present disclosure.

(3) Execution Timing of Step of Preliminarily Adjusting Conditions of Process Chamber PM As shown in FIG. 12, in a step S40, it is determined whether or not there is an execution request for the JOB pre-processing in each process chamber PM. When it is determined that there is the execution request, a step S41 is performed. When it is determined that there is no execution request, a step S46 is performed. In the step S41, it is determined whether or not the substrate S, which serves as a transfer hindering factor, is present. The transfer hindering factor is indicated by "THF" in FIG. 12.

In determining the presence or absence of the substrate S serving as the transfer hindering factor, for example, when it is determined that the unprocessed substrate S other than the substrate S serving as a factor of performing the JOB pre-processing is present in the vacuum transfer chamber TM and/or when it is determined that the number of the unprocessed substrates S serving as a factor of performing the JOB pre-processing and existing in the load lock chamber LM and the atmospheric pressure transfer chamber EFEM (including the aligner AU) is equal to or greater than the number of effective load lock chamber LM in total, it is determined that the substrate S serving as the transfer hindering factor is present. When it is determined that the substrate S serving as the transfer hindering factor is present, an execution timing of the JOB pre-processing should be adjusted. This is because a time during which the target substrate S is capable of reaching the process chamber PM where the JOB pre-processing is performed (that is, the substrate transferable time, which serves as the transfer time and includes a waiting time on the transfer structure) may be delayed than an execution completion time of the JOB pre-processing.

When it is determined, in the step S41, that the substrate S serving as the transfer hindering factor is present, a step S42 is performed, and when it is determined, in the step S41, that there is no substrate S serving as the transfer hindering factor, a step S45 is performed.

In the step S42, a time T1, which is the substrate transferable time TT of the process chamber PM of the substrate S serving as the transfer hindering factor, is acquired. The time T1 is a time during which the substrate S serving as the transfer hindering factor is capable of being transferred to the process chamber PM, and is also a time during which the substrate S to be processed in the process chamber PM for the JOB pre-processing is capable of being transferred (that is, the substrate transferable time TT). The substrate transferable time TT of the process chamber PM of the substrate S serving as the transfer hindering factor is obtained by adding the remaining time TR of the substrate processing performed in the process chamber PM at a determination timing and the scheduled execution time of the substrate transfer pre-processing (such as the JOB pre-processing and the pre-processing) performed until the candidate substrate S is transferred to the process chamber PM after the substrate processing is completed. Further, when the preceding substrate S to be processed in the same process chamber PM is present, an execution time of a transfer pre-processing, an execution time of the main-processing and an execution time of a transfer post-processing are further added thereto to obtain the substrate transferable time TT. Further, when the substrate S to be transferred is present in the process chamber PM, the scheduled execution time of the post-processings (such as the post-processing, the sheet cleaning processing and the JOB post-processing) performed after the substrate S is unloaded out of the process chamber PM is further added thereto to obtain the substrate transferable time TT.

Subsequently, a step S43 in performed. In the step S43, a processing startable time T2 of the JOB pre-processing/the warm-up type pre-processing is acquired. Then, a step S44 is performed. In the step S44, the time T1 (which is the substrate transferable time TT of the process chamber PM of the substrate S serving as the transfer hindering factor) acquired in the step S42 is compared with the processing startable time T2 of the JOB pre-processing/the warm-up type pre-processing acquired in the step S43. When the time T1 is equal to or less than the time T2, the step S45 is performed, and the JOB pre-processing is started. When the time T1 is longer than the time T2, the step S46 is performed. In the step S46, the JOB pre-processing enters a waiting state without being started.

As a result, when the substrate transferable time TT of the process chamber PM of the substrate S serving as the transfer hindering factor is equal to or less than the processing startable time T2 of the JOB pre-processing, the JOB pre-processing is performed. Thereby, it is possible to avoid a delay of the transfer of the target substrate S to the process chamber PM after a completion of the JOB pre-processing. That is, it is also possible to transfer the substrate S to the process chamber PM in accordance with the completion of the JOB pre-processing. Therefore, it is possible to reduce a temperature drop of the process chamber PM after the completion of the JOB pre-processing.

Figure 13:
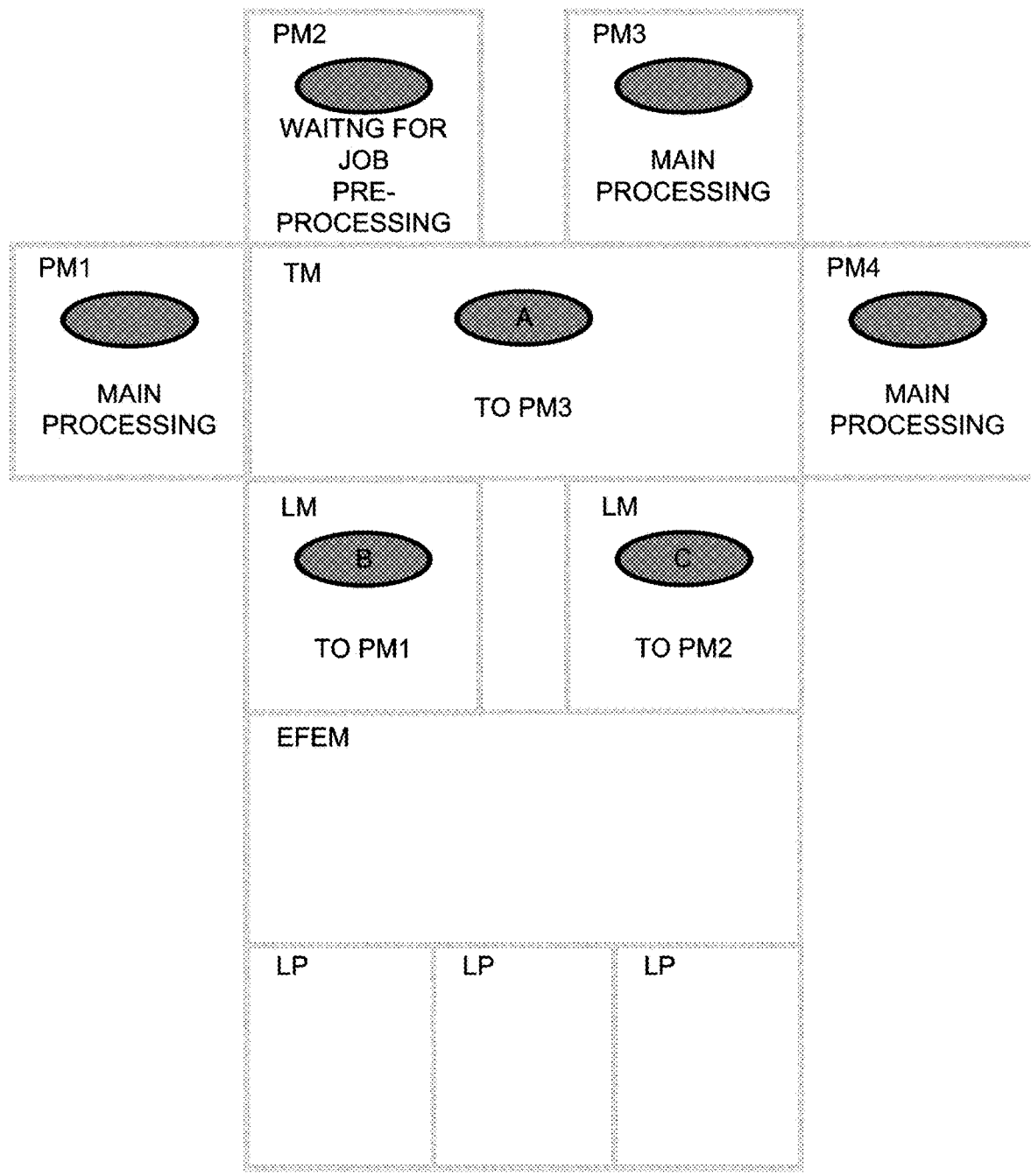
FIG. 13 is a diagram schematically illustrating an exemplary state of the substrate arrangement when the determination step of determining the execution timing of the step of preliminarily adjusting conditions of each process chamber according to the embodiments of the present disclosure is performed.

Referring to FIGS. 13 and 14, an example of an execution timing of the step of preliminarily adjusting the conditions of the process chamber PM will be described.

FIG. 13 is a diagram schematically illustrating an exemplary state of the substrate processing apparatus 10 at a determination timing (the step H7 shown in FIG. 3) of the execution timing of the step of preliminarily adjusting the conditions of the process chamber PM. In the substrate processing apparatus 10, the substrates S are respectively present in the process chambers PM1, PM3 and PM4, the vacuum transfer chamber TM and the two load lock chambers LM (that is, the load lock chambers LM1 and LM2). That is, a total of six substrates are present as the substrates S.

FIG. 14 is a table, with respect to the substrate S ("A" shown in FIG. 13) and the substrate S ("B" shown in FIG. 13) respectively arranged in the load lock chambers LM and the substrate S ("C" shown in FIG. 13) arranged in the vacuum transfer chamber Tin the state shown in FIG. 13, summarizing the remaining time of the substrate processing being performed (that is, the remaining time TR of the substrate processing) in the corresponding process chamber PM and a processing time of performing the step of preliminarily adjusting the conditions of the process chamber PM.

Referring to FIG. 13, there is the unprocessed substrate S ("A") other than the substrate S ("C") serving as a factor of performing the JOB pre-processing (the processing startable time: the scheduled execution time of the JOB pre-processing TJPre of 300,000 ms) in the vacuum transfer chamber TM. Thereby it is possible to determine that the substrate S ("A") serves as the transfer hindering factor. The substrate transferable time TT of the process chamber PM3 in which the substrate S ("A") is to be processed is 360,000 ms, which is longer than the processing startable time (for example, 300,000 ms) of the step of preliminarily adjusting the conditions of the process chamber PM2 in which the substrate S ("C") is to be processed. Therefore, the JOB pre-processing enters the waiting state in the process chamber PM2. When the substrate transferable time TT of the process chamber PM3 (which is the destination process chamber PM of the substrate S ("A")) is shorter than 300,000 ms, which is the processing startable time of the step of preliminarily adjusting the conditions of the process chamber PM2 (which is the destination process chamber PM of the substrate S ("C")), the step of preliminarily adjusting the conditions of the process chamber PM2 is performed.

(4) Control of Providing Vacancy in Load Lock Chamber of Substrate Processing Apparatus 10

It is possible to determine whether or not to provide (or create) the vacancy in the load lock chamber LM of the substrate processing apparatus 10, as will be described as follows.

Figure 15:
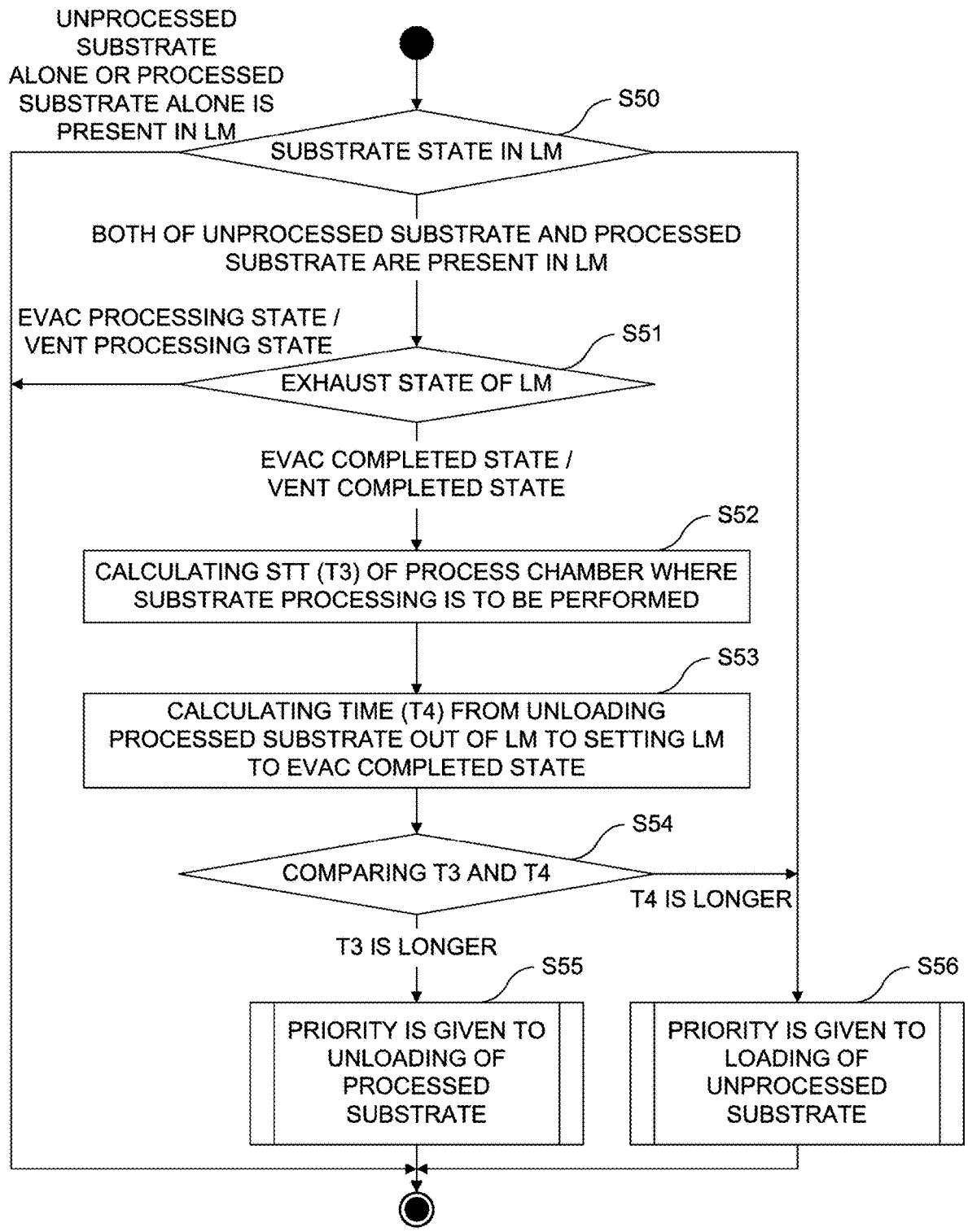
FIG. 15 is a flow chart schematically illustrating a control of providing (or creating) a vacancy in the load lock chamber according to the embodiments of the present disclosure.

As shown in FIG. 15, first, in a step S50, it is confirmed (or checked) that both of the unprocessed substrate S (or the unprocessed substrates S) and the processed substrate S (or the processed substrates S) are present in the load lock chamber LM. When it is confirmed that the unprocessed substrate S (or the unprocessed substrates S) alone or the processed substrate S (or the processed substrates S) alone is (or are) present in the load lock chamber LM, a control of providing the vacancy in the load lock chamber LM is terminated. When it is confirmed that both of the unprocessed substrate S (or the unprocessed substrates S) and the processed substrate S (or the processed substrates S) are present in the load lock chamber LM, a step S51 is performed. In the step S51, an exhaust state of the load lock chamber LM is confirmed. When the load lock chamber LM is in the EVAC processing state or the VENT processing state, the control of providing the vacancy in the load lock chamber LM is terminated. When the load lock chamber LM is in the EVAC completed state or the VENT completed state, a step S52 is performed.

In the step S52, the substrate transferable time TT of the destination process chamber PM of the substrate S is calculated as a time T3. Subsequently, a step S53 is performed.

Figure 16:
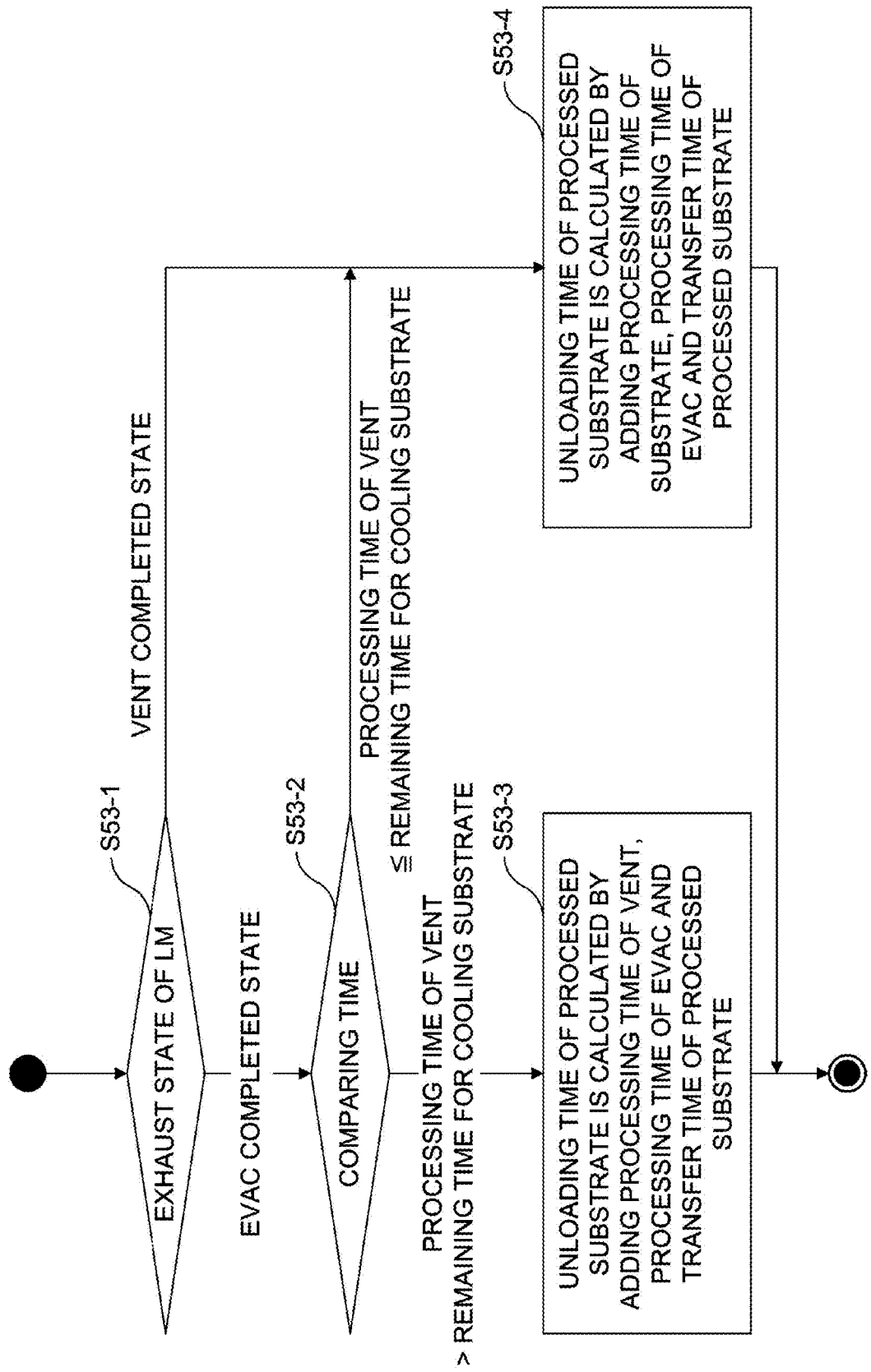
FIG. 16 is a flow chart schematically illustrating a calculation step of calculating a time from unloading a processed substrate out of the load lock chamber to setting a state of the load lock chamber to an EVAC completed state according to the embodiments of the present disclosure.

In the step S53, a time T4 of unloading (or discharging) the processed substrate S out of the load lock chamber LM until setting the state of the load lock chamber LM to the EVAC completed state is calculated. As shown in FIG. 16, the time T4 is calculated as follows. In a step S53-1, it is confirmed the exhaust state of the load lock chamber LM. When the load lock chamber LM is in the VENT completed state, a step S53-4 is performed. In the step S53-4, the unloading time T4 of the processed substrate S is calculated by adding the time for cooling the substrate S, a processing time of performing the EVAC and the transfer time of the processed substrate S.

When the exhaust state of the load lock chamber LM confirmed in the step S53-1 is the EVAC completed state, a step S53-2 is performed. In the step S53-2, the time for cooling the substrate S is compared with a processing time of performing the VENT. When the processing time of performing the VENT is equal to or less than the time for cooling the substrate S, the step S53-4 is performed. In the step S53-4, the unloading time T4 of the processed substrate S is calculated by adding a processing time of the substrate S, the processing time of performing the EVAC and the transfer time of the processed substrate S. When the processing time of performing the VENT is longer than the time for cooling the substrate S, a step S53-3 is performed. In the step S53-3, the unloading time T4 of the processed substrate S is calculated by adding the processing time of performing the VENT, the processing time of performing the EVAC and the transfer time of the processed substrate S.

Subsequently, a step S54 shown in FIG. 15 is performed. In the step S54, the time T3 is compared with the time T4. When the time T3 is longer than the time T4, in order not to delay the loading (or charging) of the unprocessed substrate S, a step S55 is performed. In the step S55, the priority is given to the unloading (or discharging) of the processed substrate S. When the time T4 is longer than the time T3, a step S56 is performed. In the step S56, the priority is given to the loading (or charging) of the unprocessed substrate S.

By setting the priority as described above, only when the transfer of the unprocessed substrate S to the process chamber PM is not delayed by transferring the processed substrate S in the load lock chamber LM to the FOUP, the processed substrate S is transferred to FOUP and the vacancy is provided in the load lock chamber LM. Thereby, it is possible to reduce the stagnation of the processed substrate S in the process chamber PM and the transfer chamber (that is, the vacuum transfer chamber TM and the atmospheric pressure transfer chamber EFEM) due to a lack of the vacancy in the load lock chamber LM. Thereby, it is possible to improve a transfer efficiency of the substrate S, and it is also possible to improve the throughput.

Figure 17:
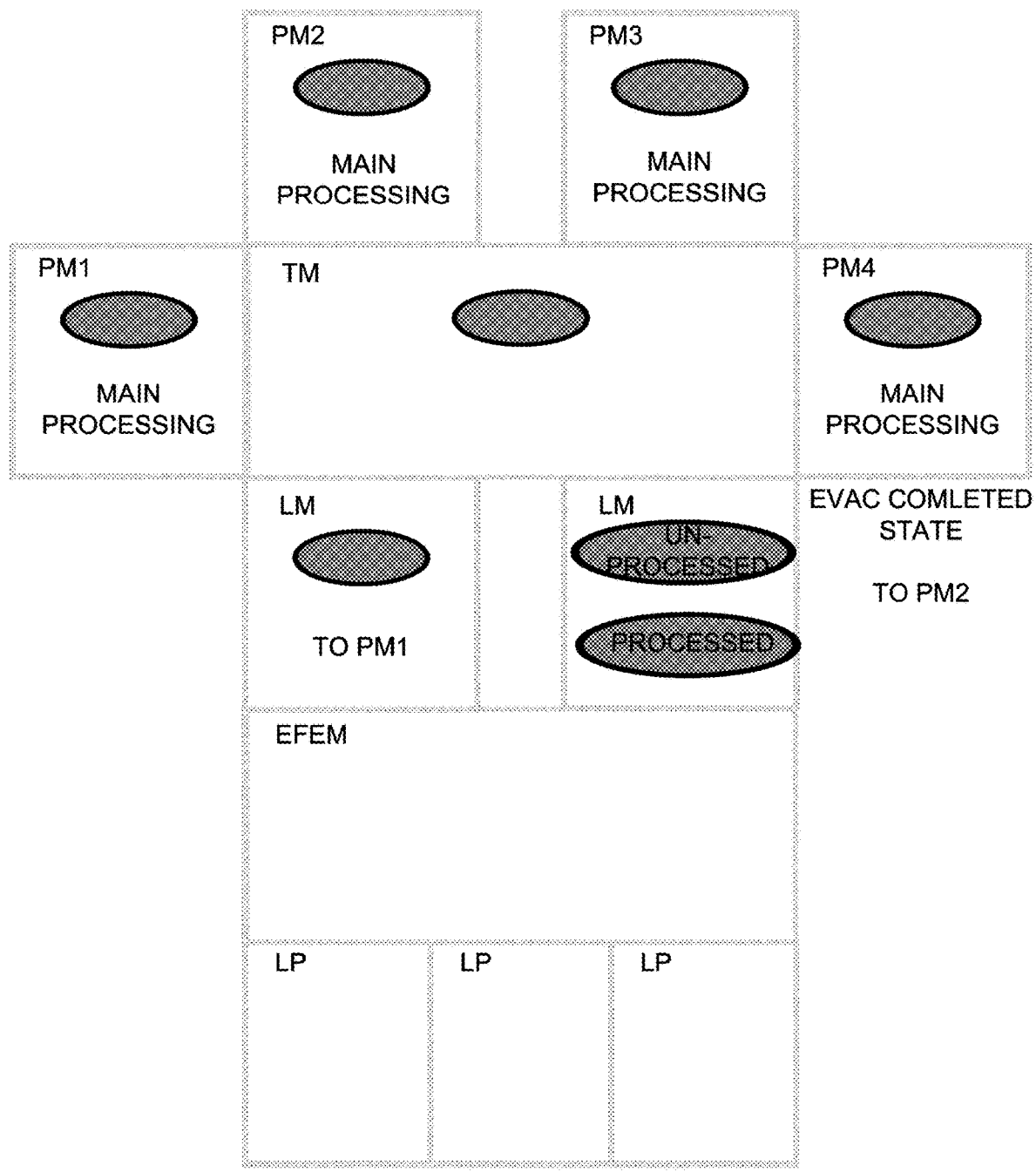
FIG. 17 is a diagram schematically illustrating an exemplary state of the substrate arrangement when a determination step of determining an execution timing of the control of providing the vacancy in the load lock chamber according to the embodiments of the present disclosure is performed.
Figures 18, 19:
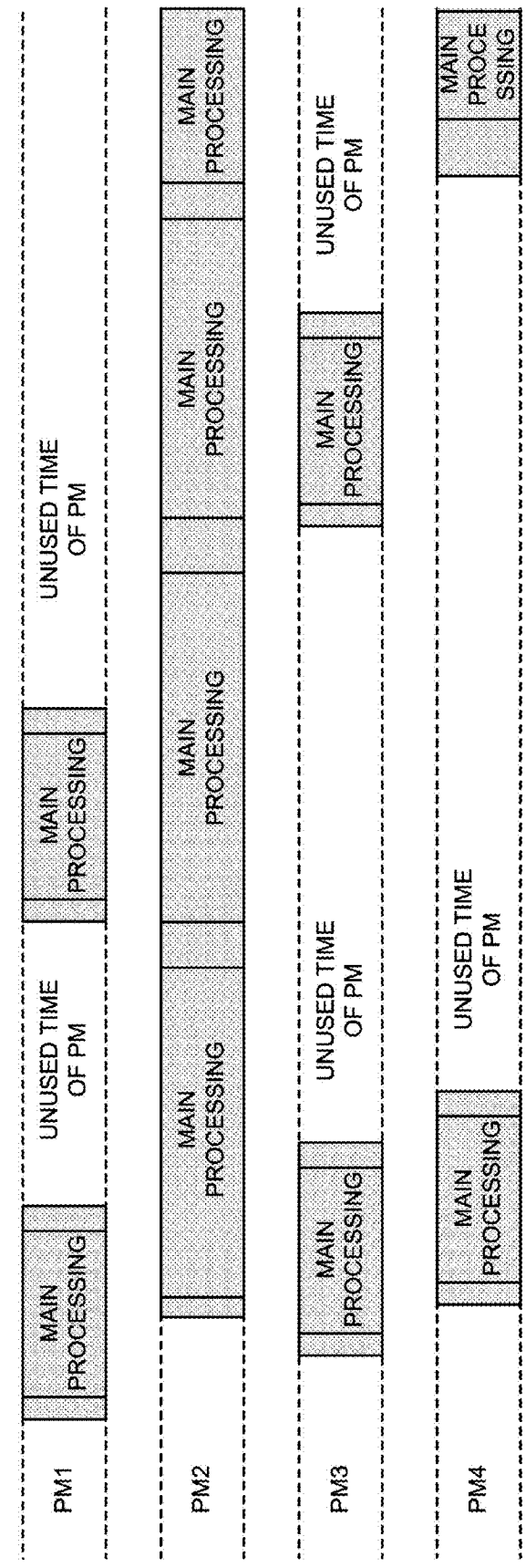
FIG. 18 is a table, with respect to each of the processed substrate and an unprocessed substrate in the state shown in FIG. 17, summarizing an unloading time T of the unprocessed substrate in the load lock chamber and the substrate transferable time of the process chamber to which the processed substrate is transferred.
FIG. 19 is a diagram schematically illustrating an example of a usage time chart of the process chamber according to a conventional parallel process.

Referring to FIGS. 17 and 18, an example of the control of providing the vacancy in the load lock chamber LM of the substrate processing apparatus 10 will be described.

FIG. 17 is a diagram schematically illustrating an exemplary state of the substrate processing apparatus 10 at a determination timing (from the step H1 to the step H4 shown in FIG. 3) of the control of providing the vacancy in the load lock chamber LM of the substrate processing apparatus 10. In the substrate processing apparatus 10, the substrates S are respectively present in the process chambers PM1, PM2, PM3 and PM4, the vacuum transfer chamber TM and the two load lock chamber LM (that is, the load lock chambers LM1 and LM2). More specifically, one substrate is present in one of the load lock chambers LM1 and LM2, and two substrates are present in the other one of the load lock chambers LM1 and LM2. That is, a total of seven substrates are present as the substrates S.

FIG. 18 is a table summarizing the time T3 (which is the substrate transferable time TT of the destination process chamber PM2 of the unprocessed substrate S arranged in the other one of the load lock chambers LM1 and LM2 in the state of FIG. 17) and the time T4 (which is the unloading time Tco of the processed substrate S arranged in the other one of the load lock chambers LM1 and LM2 in the state of FIG. 17). As shown in FIG. 18, for example, the time T3 is 150,000 ms, and the time T4 is 118,000 ms. Referring to FIG. 18, it is possible to determine that the substrate transferable time TT is not affected since the time T3 (150,000 ms) is longer than the time T4 (118,000 ms). Thereby it is possible to determine that the substrate transfer path of unloading (or discharging) the processed substrate S from the load lock chamber LM to the FOUP can be selected as the substrate transfer path, and that the control of providing the vacancy in the load lock chamber LM may be performed. Further, regarding the unloading time Tco, among the time TE for adjusting the inner atmosphere of the mounting structure to the atmosphere of the atmospheric pressure state, the time TV for adjusting the inner atmosphere of the mounting structure to an atmosphere of the vacuum state, the time TC for cooling the target substrate S and the time TAT for transferring the target substrate S in the atmosphere pressure state, the time TC for cooling the target substrate S may be partially overlapped with other time.

Figure 20:
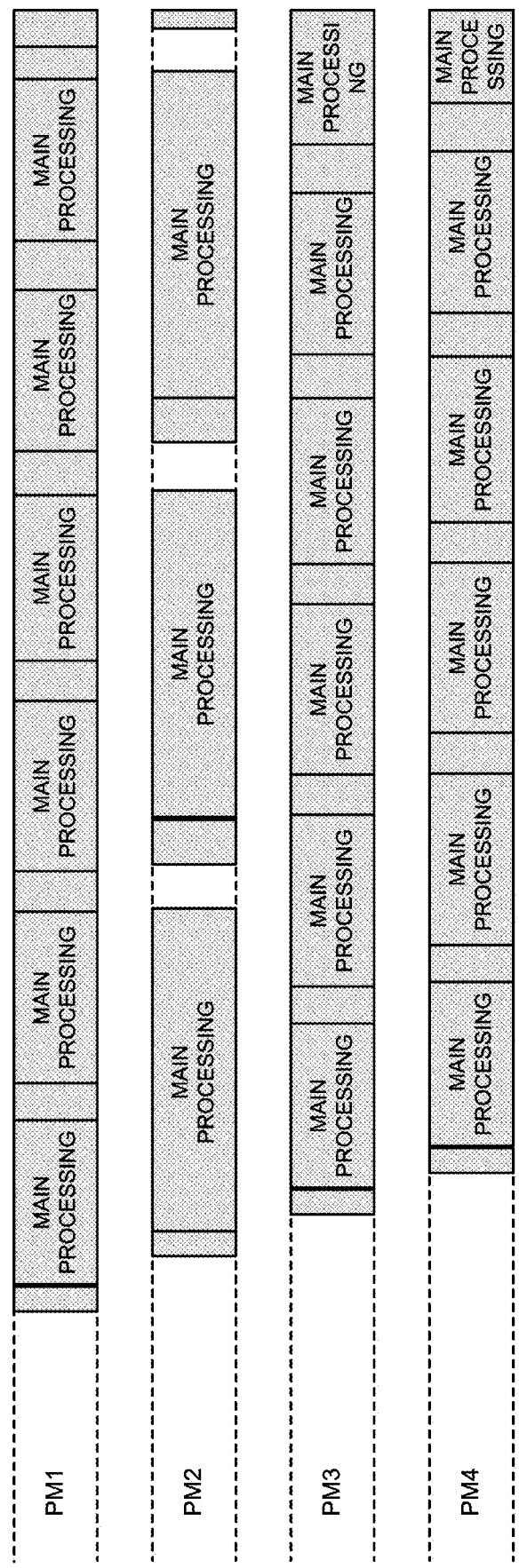
FIG. 20 is a diagram schematically illustrating an example of the usage time chart of the process chamber according to a parallel process to which the embodiments are applied.

FIGS. 19 and 20 are diagrams schematically illustrating a part of an example of a usage time chart of the process chambers PM1, PM2, PM3 and PM4 according to a parallel operation of the main-processing (5 minutes) using the process chambers PM1, PM3 and PM4 and the main-processing (10 minutes) using the process chamber PM2. In a conventional case (see FIG. 19) in which the controls (1) through (4) described above are not performed, the unused time of the process chamber PM is long. However, in a case (see FIG. 20) in which the controls (1) through (4) are performed, it is possible to confirm that there is no unused time in the process chamber PM and the overall throughput is improved.

By performing the controls (1) through (4) according to the present embodiments, even when the delay occurs in a scheduled processing, it is possible to suppress an influence of the delay by performing the processing determinations described above in real time.

Further, even when the processing is stopped due to a problem such as an occurrence of a failure in some process chamber PM, it is possible to continuously perform the processing in other process chambers PM.

Subsequently, an example of the substrate processing performed in the process chamber PM which is the destination process chamber. For example, by performing an alternate supply process serving as an example of the substrate processing, a film of a desired thickness is formed on a surface of the substrate S.

In the substrate processing, a desired film is formed by using a plurality of process gases and by repeatedly performing a first step and a second step. Specifically, the desired film is formed by supplying a first gas into the process chamber PM through the gas supplier in the first step and supplying a second gas into the process chamber PM through the gas supplier in the second step performed after the first step. A purge step of purging the inner atmosphere of the process chamber may be performed between the first step and the second step. A cycle (which is a combination of the first step, the purge step and the second step) is performed at least once, preferably a plurality number of times. By performing the cycle, for example, a silicon-containing film is formed on the substrate S.

For example, the substrate processing is described by way of an example in which the alternate supply process is performed. However, the substrate processing is not limited thereto. For example, as the substrate processing, a film-forming process in which the first gas and the second gas are supplied in parallel to the process chamber PM to form the desired film, or a modification process in which a modification gas such as oxygen is supplied to modify the film formed on the substrate S may be formed. Further, various processes such as an ashing process and an etching process may be performed.

According to some embodiments of the present disclosure, it is possible to improve the throughput by suppressing the occurrence of the stagnation of the preceding substrate in the structure such as the transfer chamber and by reducing the unused time of the process chamber.

What is claimed is:

1. A substrate processing apparatus comprising:
   a plurality of process chambers in which a substrate among a plurality of substrates is processed;
   a transfer chamber provided with a transfer structure configured to transfer the substrate; and
   a controller configured to perform:
   (a) calculating a substrate transferable time during which the substrate is transferable to each of the plurality of process chambers;
   (b) selecting a substrate transfer path to a process chamber among the plurality of process chambers such that the substrate transferable time is the shortest among those calculated in (a);
   (c) performing a control of the transfer structure based on the substrate transfer path selected in (b); and
   (d) controlling a start time of a pre-processing in the process chamber such that the substrate transferable time arrives in accordance with an elapse of a processing startable time based on the substrate transferable time to the process chamber and the processing startable time of the substrate in the process chamber.

2. The substrate processing apparatus of claim 1, wherein the controller is further configured to calculate the substrate transferable time based on a remaining time of a substrate processing in each of the plurality of process chambers, a scheduled execution time of a processing in each of the plurality of process chambers with respect to a preceding substrate being transferred by the transfer structure and a transfer time of the substrate at the transfer structure corresponding to each of the plurality of process chambers.

3. The substrate processing apparatus of claim 1, further comprising:
   a plurality of mounting structures on which the plurality of substrates are placed, and
   wherein the controller is further configured to perform:
   calculating the substrate transferable time with respect to the plurality of substrates placed on the plurality of mounting structures during which each of the plurality of substrates is transferable to each of the plurality of process chambers; and
   performing the control of the transfer structure such that the substrate whose substrate transferable time is the shortest is transferred toward the process chamber.

4. The substrate processing apparatus of claim 3, further comprising:
   a plurality of arrangement structures on which a container configured to accommodate the plurality of substrates is arranged,
   wherein the controller is further configured to perform the control of the transfer structure such that a processed substrate is transferred to the plurality of arrangement structures when an unprocessed substrate and the processed substrate among the plurality of substrates are arranged on the plurality of mounting structures and when a time during which the unprocessed substrate is transferred to the process chamber after the processed substrate is transferred to the plurality of arrangement structures is shorter than the substrate transferable time of the process chamber.

5. The substrate processing apparatus of claim 4, wherein the substrate transfer path is selected based on a transfer time of the substrate among each of the plurality of mounting structures, the plurality of arrangement structures, the transfer chamber and the process chamber.

6. The substrate processing apparatus of claim 4, wherein the transfer chamber comprises an atmospheric pressure transfer chamber provided between the plurality of arrangement structures and the plurality of mounting structures and configured such that the substrate is to be transferred in an atmospheric pressure state.

7. The substrate processing apparatus of claim 6, wherein the transfer structure is arranged in the atmospheric pressure transfer chamber and is configured to transfer the substrate in the atmospheric pressure state.

8. The substrate processing apparatus of claim 3, wherein the transfer chamber comprises a vacuum transfer chamber provided between the plurality of process chambers and the plurality of mounting structures and configured such that the substrate is to be transferred in a vacuum state.

9. The substrate processing apparatus of claim 8, wherein the transfer structure is arranged in the vacuum transfer chamber and is configured to be transfer the substrate in the vacuum state.

10. The substrate processing apparatus of claim 3, wherein an inner atmosphere of each of the plurality of mounting structures is to be switched between an atmospheric pressure state and a vacuum state, and each of the plurality of mounting structures is provided with a configuration on which one or more substrates are to be placed.

11. The substrate processing apparatus of claim 10, wherein, when an unprocessed substrate and a processed substrate among the plurality of substrates are placed on a mounting structure among the plurality of mounting structures, the controller is further configured to perform:
    calculating a time during which the unprocessed substrate is transferable to the process chamber and a time during which the processed substrate is unloaded from the mounting structure and an inner atmosphere of the mounting structure is set to be in a vacuum state; and
    providing a vacancy in the mounting structure by unloading the processed substrate from the mounting structure when the time during which the unprocessed substrate is transferable to the process chamber is not affected thereby.

12. The substrate processing apparatus of claim 11, wherein, when the unprocessed substrate and the processed substrate among the plurality of substrates are placed on a mounting structure among the plurality of mounting structures, the controller is further configured to perform:

confirming an exhaust state of the mounting structure; and continuously performing an exhaust processing when the exhaust state of the mounting structure is an incomplete state.

13. The substrate processing apparatus of claim 1, wherein, the controller is further configured to calculate a time for eliminating a stagnation when the stagnation occurs due to a transfer of an unprocessed substrate and controlling the start time of the pre-processing in the process chamber based on the time for eliminating the stagnation.

14. A method of manufacturing a semiconductor device, comprising:
(A) processing a substrate among a plurality of substrates in a plurality of process chambers;
(B) transferring the substrate; and
(C) performing: (a) calculating a substrate transferable time during which the substrate is transferable to each of the plurality of process chambers; (b) selecting a substrate transfer path to a process chamber among the plurality of process chambers such that the substrate transferable time is the shortest among those calculated in (a); (c) controlling a transfer structure based on the substrate transfer path selected in (b); and (d) controlling a start time of a pre-processing in the process chamber such that the substrate transferable time arrives in accordance with an elapse of a processing startable time based on the substrate transferable time to the process chamber and the processing startable time of the substrate in the process chamber.

15. A non-transitory computer-readable recording medium storing a program that causes, by a computer, a substrate processing apparatus to perform:
(A) processing a substrate among a plurality of substrates in a plurality of process chambers;
(B) transferring the substrate; and
(C) performing: (a) calculating a substrate transferable time during which the substrate is transferable to each of the plurality of process chambers; (b) selecting a substrate transfer path to a process chamber among the plurality of process chambers such that the substrate transferable time is the shortest among those calculated in (a); (c) controlling a transfer structure based on the substrate transfer path selected in (b); and (d) controlling a start time of a pre-processing in the process chamber such that the substrate transferable time arrives in accordance with an elapse of a processing startable time based on the substrate transferable time to the process chamber and the processing startable time of the substrate in the process chamber.

* * * * *